(12) United States Patent
Kim et al.

(10) Patent No.: US 12,113,154 B2
(45) Date of Patent: Oct. 8, 2024

(54) DISPLAY DEVICE AND MANUFACTURING METHOD THEREOF

(71) Applicant: Samsung Display Co., LTD., Yongin-si (KR)

(72) Inventors: Su Jeong Kim, Yongin-si (KR); Yi Seop Shim, Yongin-si (KR); Yun Ho Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 327 days.

(21) Appl. No.: 17/387,479

(22) Filed: Jul. 28, 2021

(65) Prior Publication Data

US 2022/0209071 A1    Jun. 30, 2022

(30) Foreign Application Priority Data

Dec. 30, 2020 (KR) .................. 10-2020-0188366

(51) Int. Cl.
*H01L 33/38* (2010.01)
*H01L 27/15* (2006.01)
*H01L 33/00* (2010.01)

(52) U.S. Cl.
CPC .......... *H01L 33/387* (2013.01); *H01L 27/156* (2013.01); *H01L 33/005* (2013.01); *H01L 2933/0016* (2013.01)

(58) Field of Classification Search
CPC ......... H01L 21/67017; H01L 21/67144; H01L 21/67253; H01L 21/673; H01L 2224/75655; H01L 2224/95101; H01L 24/75; H01L 24/95; H01L 2924/12041; H01L 33/005; H01L 33/0095
See application file for complete search history.

(56) References Cited

U.S. PATENT DOCUMENTS

| | | | |
|---|---|---|---|
| 2018/0175104 A1* | 6/2018 | Kang | H01L 33/005 |
| 2018/0175106 A1* | 6/2018 | Kim | H01L 33/385 |
| 2019/0181301 A1* | 6/2019 | Kim | H01L 33/44 |
| 2021/0296543 A1* | 9/2021 | Aoyama | H01L 33/504 |

* cited by examiner

*Primary Examiner* — Matthew C Landau
*Assistant Examiner* — Dmitriy Yemelyanov
(74) *Attorney, Agent, or Firm* — KILE PARK REED & HOUTTEMAN PLLC

(57) ABSTRACT

A display device includes a substrate including pixels; a first electrode and a second electrode that are spaced apart from each other on the substrate; a light emitting element disposed between the first electrode and the second electrode; a first connection electrode electrically contacting the first electrode and a first end of the light emitting element; a second connection electrode electrically contacting the second electrode and another end of the light emitting element; and an organic pattern disposed between the first connection electrode and the second connection electrode and on the light emitting element. The organic pattern tapers toward the light emitting element.

14 Claims, 14 Drawing Sheets

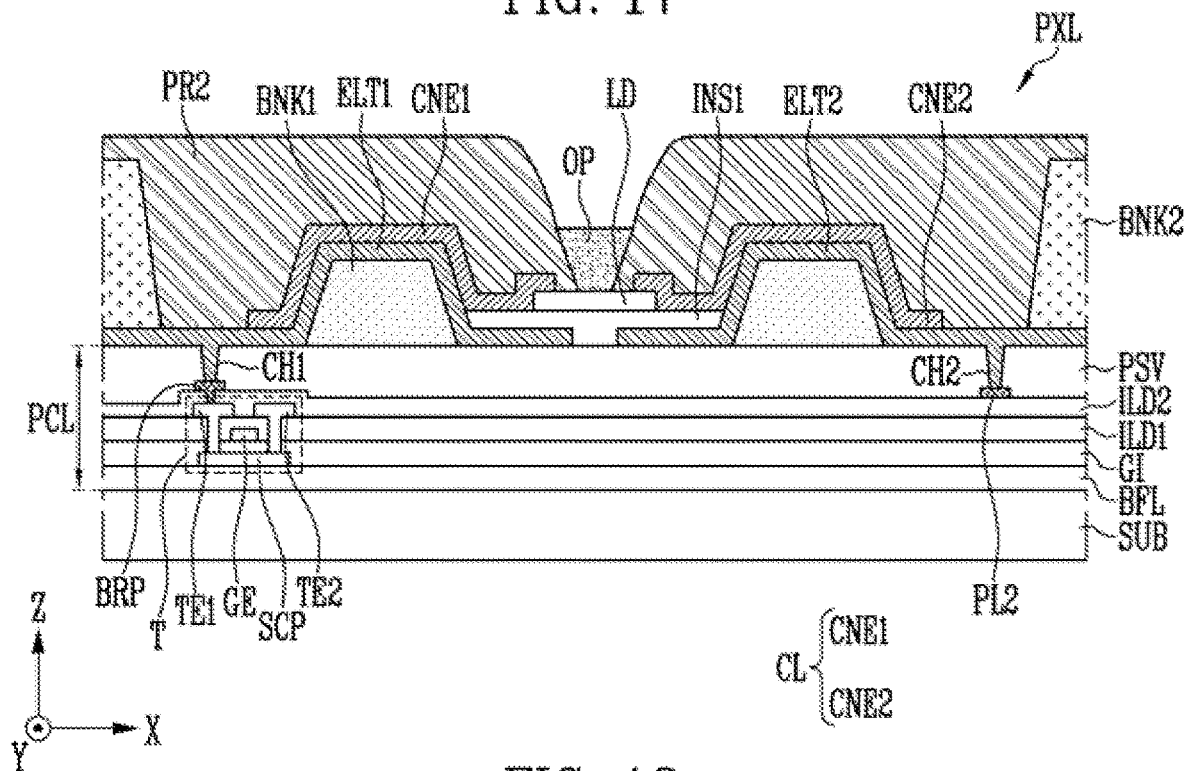
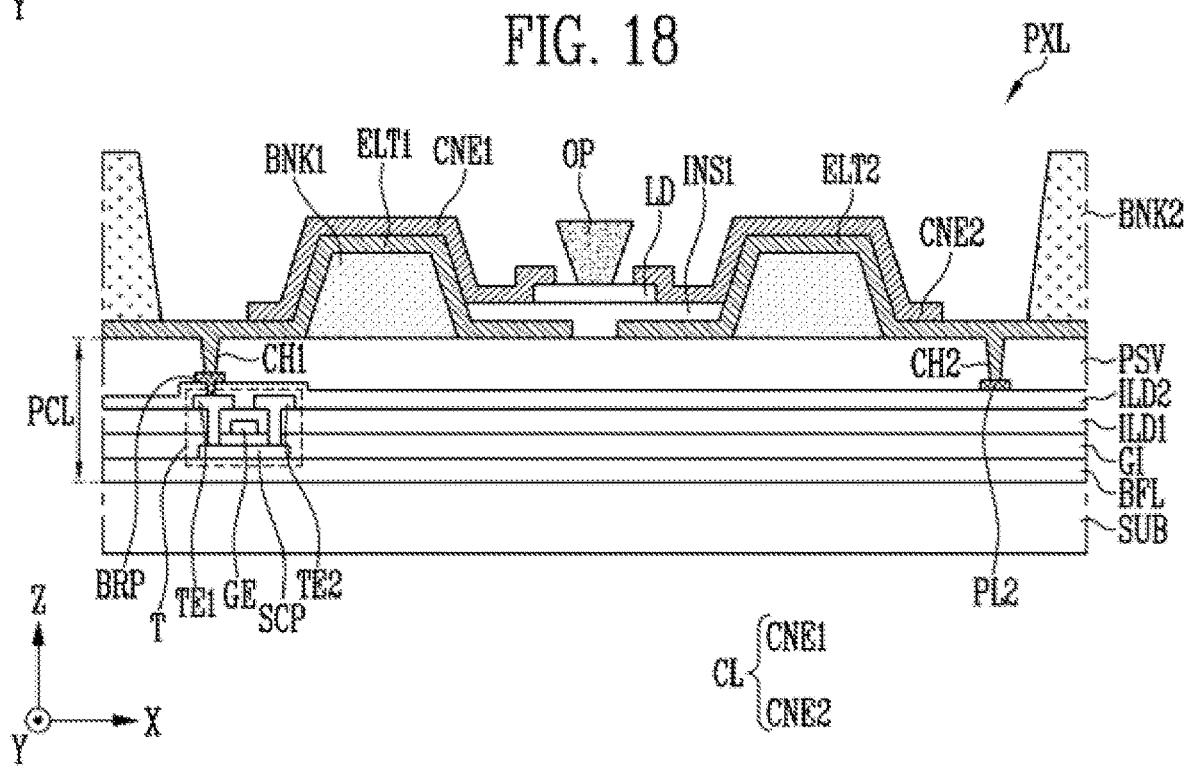

DISPLAY DEVICE AND MANUFACTURING METHOD THEREOF

CROSS-REFERENCE TO RELATED APPLICATION(S)

This application claims priority to and the benefit of Korean Patent Application No. 10-2020-0188366 under 35 U.S.C. § 119, filed in the Korean Intellectual Property Office (KIPO) on Dec. 30, 2020, the entire contents of which are incorporated herein by reference.

BACKGROUND

1. Technical Field

The disclosure relates to a display device and a manufacturing method thereof.

2. Description of Related Art

Recently, as interest in an information display is increasing, research and development for display devices are continuously conducted.

SUMMARY

The disclosure has been made in an effort to provide a display device and a manufacturing method thereof that may simplify a manufacturing process of the display device by reducing the number of masks.

The objects of the disclosure are not limited to the object mentioned above, and other technical objects that are not mentioned may be clearly understood to a person of an ordinary skill in the art using the following description.

An embodiment provides a display device including a substrate including pixels; a first electrode and a second electrode that are spaced apart from each other on the substrate; a light emitting element disposed between the first electrode and the second electrode; a first connection electrode electrically contacting the first electrode and a first end of the light emitting element; a second connection electrode electrically contacting the second electrode and another end of the light emitting element; and an organic pattern disposed between the first connection electrode and the second connection electrode and on the light emitting element. The organic pattern may taper toward the light emitting element.

A side surface of the organic pattern may be spaced apart from the first connection electrode.

A width between the side surface of the organic pattern and the first connection electrode may be about 0.2 μm or greater.

The pixels may include a first pixel that emits a first color, a second pixel that emits a second color, and a third pixel that emits a third color, and the organic pattern may selectively transmit the third color.

The display device may further include a first color filter disposed in the first pixel; a second color filter disposed in the second pixel; and a third color filter disposed in the third pixel.

The organic pattern and the third color filter may include a same material.

The first connection electrode and the second connection electrode may be made of a same conductive layer.

The organic pattern may expose the first end and another end of the light emitting element.

The display device may further include an insulation layer contacting and overlapping the side surface of the organic pattern.

The insulation layer may contact and overlap the first connection electrode and the second connection electrode.

The display device may further include a conductive pattern disposed on the organic pattern.

The conductive pattern may be disposed between the first connection electrode and the second connection electrode.

The conductive pattern may be electrically disconnected from the first connection electrode and the second connection electrode.

The conductive pattern, the first connection electrode, and the second connection electrode may include a same material.

A thickness of the conductive pattern may be substantially equal to a thickness of the first connection electrode and a thickness of the second connection electrode.

Another embodiment provides a manufacturing method of a display device, including forming a first electrode and a second electrode spaced apart from each other; aligning a light emitting element between the first electrode and the second electrode; forming an organic film on the light emitting element; over-etching the organic film to form an organic pattern tapering toward the light emitting element; and forming a connection electrode layer on the light emitting element. The connection electrode layer may include a first connection electrode formed on a first end of the light emitting element and a second connection electrode formed on another end of the light emitting element, and the first connection electrode and the second connection electrode may be electrically disconnected by the organic pattern.

The connection electrode layer may further include a conductive pattern provided on the organic pattern.

The first connection electrode, the second connection electrode, and the conductive pattern may be simultaneously formed by a same process.

The display device may further include removing the conductive pattern after the forming of the connection electrode layer.

The manufacturing method of the display device may further include forming an insulation layer overlapping the first connection electrode, the second connection electrode, and the organic pattern after the forming of the connection electrode layer.

Particularities of other embodiments are included in the detailed description and drawings.

According to the embodiment of the disclosure, since an organic pattern is formed to have a reversed-tapered structure, it is possible to prevent a first connection electrode and a second connection electrode from being short-circuited, so that the first connection electrode and the second connection electrode may be simultaneously formed. That is, it is possible to simplify a manufacturing process of a display device by reducing the number of masks.

Effects of embodiments of the disclosure are not limited by what is illustrated in the above, and more various effects are included in the specification.

BRIEF DESCRIPTION OF THE DRAWINGS

An additional appreciation according to the embodiments of the disclosure will become more apparent by describing in detail the embodiments thereof with reference to the accompanying drawings, wherein:

FIG. 16 to FIG. 18 schematically illustrate cross-sectional views of process steps of a manufacturing method of a display device according to another embodiment.

DETAILED DESCRIPTION OF THE EMBODIMENTS

Figure 1:
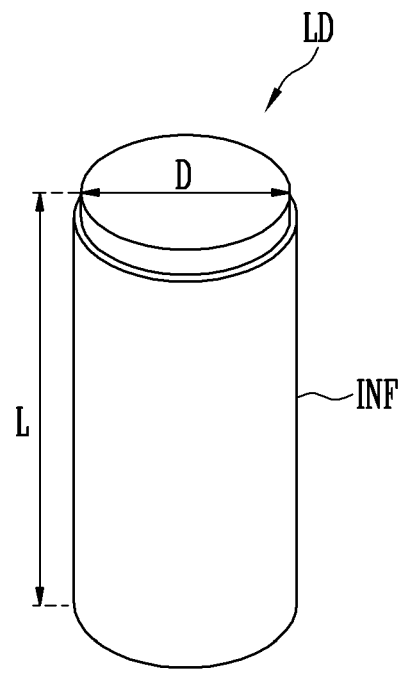
FIG. 1 and FIG. 2 schematically illustrates a perspective view and a cross-sectional view of a light emitting element according to an embodiment, respectively.

Advantages and features of the disclosure and methods of accomplishing the same may be understood more readily by reference to the following detailed description of embodiments and the accompanying drawings. The disclosure may, however, be embodied in different forms and should not be construed as limited to the embodiments set forth herein. The embodiments are provided so that this disclosure will be thorough and complete, and will convey the scope of the disclosure to those skilled in the art, and further, the disclosure is only defined by scopes of claims.

The terms used herein are for the purpose of describing particular embodiments only and is not intended to be limiting. As used herein, the singular forms "a," "an," and "the" are intended to include the plural meanings as well, unless the context clearly indicates otherwise. It will be further understood that the terms "comprise" and/or "comprising," "include" or "including," and "have" or "having," when used in the present disclosure, specify the presence of stated elements, steps, operations, and/or devices, but do not preclude the presence or addition of one or more other elements, steps, operations, and/or devices.

In addition, the term "connection" or "coupling" may comprehensively mean a physical and/or electrical connection or coupling. Further, this may comprehensively mean a direct or indirect connection or coupling, and an integrated or non-integrated connection or coupling.

It will be understood that when an element or a layer is referred to as being "on" another element or layer, it can be directly on another element or layer, or intervening element or layer may also be present. Throughout the specification, the same reference numerals denote the same constituent elements.

Although the terms "first," "second," and the like are used to describe various elements, these elements are not limited by these terms. These terms are used only to distinguish one element from another element. Therefore, the first elements described below may be the second elements within the technical spirit of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection or coupling. The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described in detail with reference to the accompanying drawings.

Figure 2:
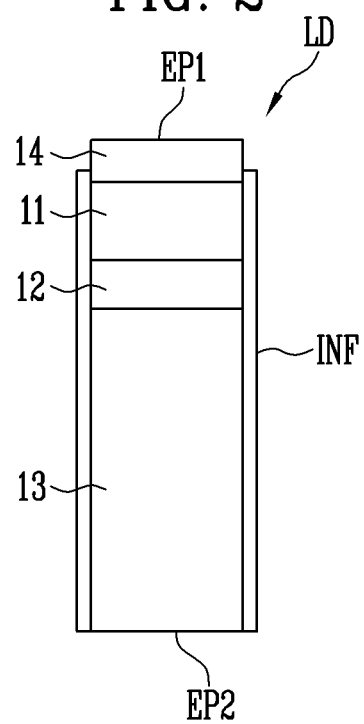

FIGS. 1 and 2 illustrate a schematic perspective view and a schematic cross-sectional view of a light emitting element according to an embodiment, respectively. FIGS. 1 and 2 illustrate a cylindrical light emitting element LD, but a type and/or shape of the light emitting element LD is not limited thereto.

Referring to FIGS. 1 and 2, a light emitting element (or light emitting diode) LD may include a first semiconductor layer 11, an active layer 12, a second semiconductor layer 13, and/or an electrode layer 14.

The light emitting element LD may be formed to have a cylindrical shape extending in a direction. The light emitting element LD may have a first end portion EP1 and a second end portion EP2. One of the first and second semiconductor layers 11 and 13 may be disposed on the first end portion EP1 of the light emitting element LD. The remaining one of the first and second semiconductor layers 11 and 13 may be disposed on the second end portion EP2 of the light emitting element LD.

In some embodiments, the light emitting element LD may be a light emitting element manufactured in a cylindrical shape by an etching method or the like. In the specification, the "cylindrical shape" includes a rod-like shape or bar-like shape with an aspect ratio greater than 1, such as a circular cylinder or a polygonal cylinder, but a shape of a cross-section thereof is not limited.

The light emitting element LD may have a size as small as a nanometer scale to a micrometer scale. For example, the light emitting element LD may each have a diameter (or width) D and/or a length L ranging from a nanometer scale to a micrometer scale. However, the size of the light emitting element LD is not limited thereto, and the size of the light emitting element LD may be variously changed according to design conditions of various devices using a light emitting device using the light emitting element LD as a light source, for example, a display device.

The first semiconductor layer 11 may be a first conductive semiconductor layer. For example, the first semiconductor layer 11 may include a p-type semiconductor layer. For example, the first semiconductor layer 11 may include at least one semiconductor material of InAlGaN, GaN, AlGaN, InGaN, AlN, and InN and may include a p-type semiconductor layer doped with a first conductive dopant such as Mg. However, the material included in the first semiconductor layer 11 is not limited thereto, and the first semiconductor layer 11 may be made of various materials.

The active layer 12 may be disposed between the first semiconductor layer 11 and the second semiconductor layer 13 and may be formed to have a single-quantum or multi-quantum well structure. A position of the active layer 12 may be variously changed according to a type of the light emitting element LD. A clad layer (not shown) doped with a conductive dopant may be formed at an upper portion and/or a lower portion of the active layer 12. For example, the cladding layer may be formed of AlGaN or InAlGaN. In some embodiments, a material such as AlGaN and InAlGaN may be used to form the active layer 12, and various materials may form the active layer 12.

The second semiconductor layer 13 is disposed to on the active layer 12 and may include a semiconductor layer of a type different from that of the first semiconductor layer 11. The second semiconductor layer 13 may include an n-type semiconductor layer. For example, the second semiconductor layer 13 may include at least one semiconductor material, e.g., at least one of InAlGaN, GaN, AlGaN, InGaN, AlN, and InN and may include an n-type semiconductor layer doped with a second conductive dopant such as Si, Ge, Sn, or the like. However, the material included in the second semiconductor layer 13 is not limited thereto, and the second semiconductor layer 13 may be made of various materials.

In case that a voltage of a threshold voltage or more is applied to respective ends of the light emitting element LD, the light emitting device LD emits light while electron-hole pairs are combined in the active layer 12. By controlling the light emission of the light emitting element LD by using this principle, the light emitting element LD may be used as a light source for various light emitting devices, including pixels of a display device.

The electrode layer 14 may be disposed on the first end portion EP1 and/or the second end portion EP2 of the light emitting element LD. FIG. 2 illustrates a case in which the electrode layer 14 is formed on the first semiconductor layer 11, but the disclosure is not limited thereto. For example, a separate electrode layer may be further disposed on the second semiconductor layer 13.

The electrode layer 14 may include a transparent metal or a transparent metal oxide. As an example, the electrode layer 14 may include at least one of an indium tin oxide (ITO), an indium zinc oxide (IZO), a zinc oxide (ZnO), and a zinc tin oxide (ZTO), but is not limited thereto. As described above, in case that the electrode layer 14 is made of a transparent metal or transparent metal oxide, light generated in the active layer 12 of the light emitting element LD may transmit through the electrode layer 14 and be emitted to the outside of the light emitting element LD.

The light emitting element LD may further include an insulation film INF formed on a surface thereof. The insulation film INF may be directly disposed on surfaces of the first semiconductor layer 11, the active layer 12, the second semiconductor layer 13, and/or the electrode layer 14. The insulation film INF may expose the first and second end portions EP1 and EP2 of the light emitting element LD having different polarities. In some embodiments, the insulation film INF may expose side portions of the electrode layer 14 and/or the second semiconductor layer 13 that are adjacent to the first and second end portions EP1 and EP2 of the light emitting element LD.

The insulation film INF may include at least one of an aluminum oxide ($AlO_x$), an aluminum nitride ($AlN_x$), a silicon oxide ($SiO_x$), a silicon nitride ($SiN_x$), a silicon oxynitride ($SiO_xN_y$), a zirconium oxide ($ZrO_x$), a hafnium oxide ($HfO_x$), and a titanium oxide ($TiO_x$). For example, the insulation film INF may be configured (or formed) as a double layer, and respective layers configuring the double layer may include different materials. Respective layers configuring the double layer of the insulation film INF may be formed by different processes. In an embodiment, the insulation film INF may be configured as a double layer made of an aluminum oxide ($AlO_x$) and a silicon oxide ($SiO_x$), but the disclosure is not limited thereto. In some embodiments, the insulation film INF may be omitted.

In case that the insulation film INF is provided on a surface of the light emitting element LD, it is possible to prevent the active layer 12 from being short-circuited with at least one electrode (for example, at least one among connection electrodes electrically connected to respective ends of the light-emitting element LD). Therefore, electrical stability of the light emitting element LD may be secured. Further, it is possible to improve the lifespan and efficiency of the light emitting element LD by reducing or minimizing surface defects of the light emitting element LD.

FIGS. 1 and 2 illustrate the cylindrical light emitting element LD, but the type, structure, and/or shape of the light emitting element LD may be variously changed.

A light emitting device including the light emitting element LD described above may be used in various types of devices that require a light source in addition to a display device. For example, the light emitting elements LD may be disposed in each pixel of a display panel, and the light emitting elements LD may be used as a light source of each pixel. However, an application field of the light emitting element LD is not limited to the above-described example. For example, the light emitting element LD may be used in other types of devices that require a light source, such as a lighting device.

Figure 3:
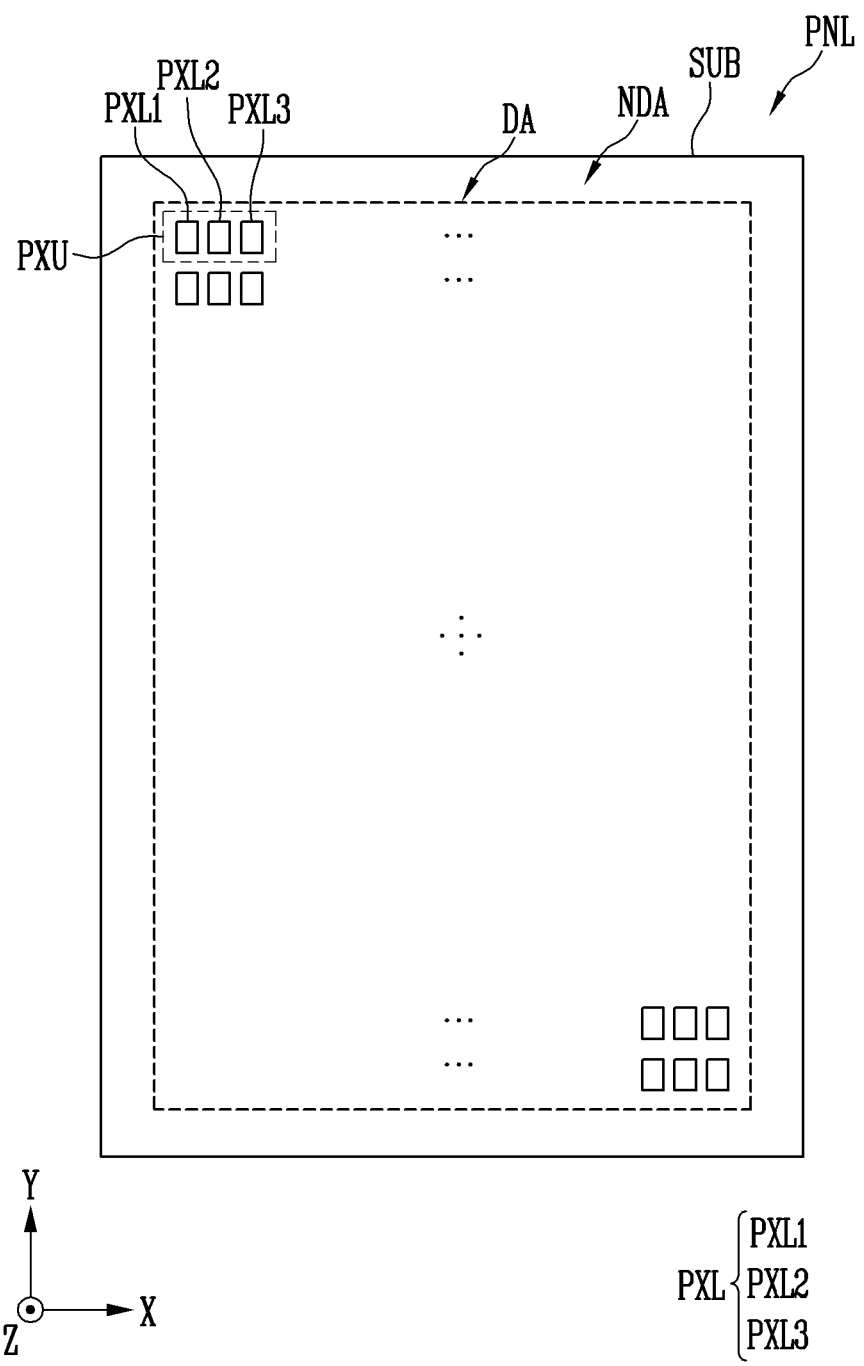
FIG. 3 schematically illustrates a plan view of a display device according to an embodiment.

FIG. 3 illustrates a schematic plan view of a display device according to an embodiment.

FIG. 3 illustrates a display device, in particular, a display panel PNL provided in the display device, as an example of an electronic device that may use the light emitting element LD described in the embodiments of FIGS. 1 and 2 as a light source.

Each pixel unit PXU of the display panel PNL and each pixel configuring the same may include at least one light emitting element LD. For better understanding and ease of description, FIG. 3 briefly illustrates the structure of the display panel PNL based on a display area DA. However, in some embodiments, at least one driving circuit portion (for example, at least one of a scan driver and a data driver), wires (lines), and/or pads, which are not shown, may be further disposed on the display panel PNL.

Referring to FIG. 3, the display panel PNL may include a substrate SUB and the pixel unit PXU disposed on the substrate SUB. The pixel unit PXU may include first pixels PXL1, second pixels PXL2, and/or third pixels PXL3. Hereinafter, when referring to one or more pixels among the first pixels PXL1, the second pixels PXL2, and the third pixels PXL3, or when comprehensively referring to two or more types of pixels, they will be referred to as a "pixel PXL" or "pixels PXL."

The substrate SUB configures a base member of the display panel PNL and may be a rigid or flexible substrate or film. For example, the substrate SUB may be formed as a rigid substrate made of glass or tempered glass and as a flexible substrate made of a plastic or metallic material (or a thin film), but the material and/or physical properties of the substrate SUB are not particularly limited.

The display panel PNL and the substrate SUB for forming the display panel may include a display area DA for displaying an image and a non-display area NDA excluding the display area DA. The pixels PXL may be disposed in the display area DA. In the non-display area NDA, various wires, pads, and/or internal circuit parts electrically connected to the pixels PXL of the display area DA may be disposed. The pixels PXL may be regularly arranged in a stripe or PENTILE™ arrangement structure. However, the arrangement structure of the pixels PXL is not limited thereto, and the pixels PXL may be arranged in the display area DA in various structures and/or methods.

In some embodiments, two or more types of pixels PXL emitting light of different colors may be disposed in the display area DA. For example, in the display area DA, the first pixels PXL1 emitting light of a first color, the second pixels PXL2 emitting light of a second color, and the third pixels PXL3 emitting light of a third color may be arranged. At least one first to third pixels PXL1, PXL2, and PXL3 disposed to be adjacent to each other may form a pixel unit PXU that may emit light of various colors. For example, each of the first to third pixels PXL1, PXL2, and PXL3 may be a sub-pixel that emits light of a predetermined color. In some embodiments, the first pixel PXL1 may be a red pixel that emits red light, the second pixel PXL2 may be a green pixel that emits green light, and the third pixel PXL3 may be a blue pixel that emits blue light, but the disclosure is not limited thereto.

In an embodiment, the first pixel PXL1, the second pixel PXL2, and the third pixel PXL3 are provided with light emitting elements of the same color, and may include color conversion layers and/or color filters of different colors disposed on respective light emitting elements, so that they may emit light of the first color, light of the second color, and light of the third color, respectively. In an embodiment, the first pixel PXL1, the second pixel PXL2, and the third pixel PXL3 are each provided with a first color light emitting element, a second color light emitting element, and a third color light emitting element as a light source, respectively, so that they respectively emit light of the first color, second color, and third color. However, the color, type, and/or number of pixels PXL forming each pixel unit PXU are not particularly limited. For example, the color of light emitted by each pixel PXL may be variously changed.

The pixel PXL may include at least one light source driven by a control signal (for example, a scan signal and a data signal) and/or a power source (for example, a first power source and a second power source). In an embodiment, the light source may include at least one light emitting device LD according to one of the embodiments of FIGS. 1 and 2, for example, ultra-small cylindrical shape light emitting elements LD having a size as small as nanometer scale to micrometer scale. However, the disclosure is not limited thereto, and various types of light emitting elements LD may be used as a light source of the pixel PXL.

In an embodiment, each pixel PXL may be configured as an active pixel. However, the type, structure, and/or driving method of pixels PXL that may be applied to the display device are not particularly limited. For example, each pixel PXL may be configured as a pixel of a passive or active light emitting display device of various structures and/or driving methods.

Figure 4:
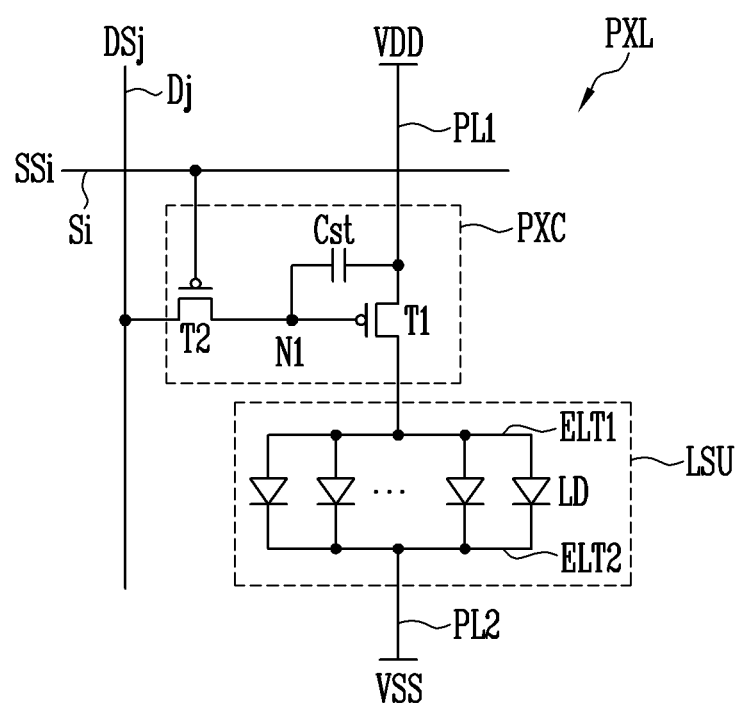
FIG. 4 to FIG. 6 schematically illustrate circuit diagrams of a pixel according to an embodiment.
Figure 5:
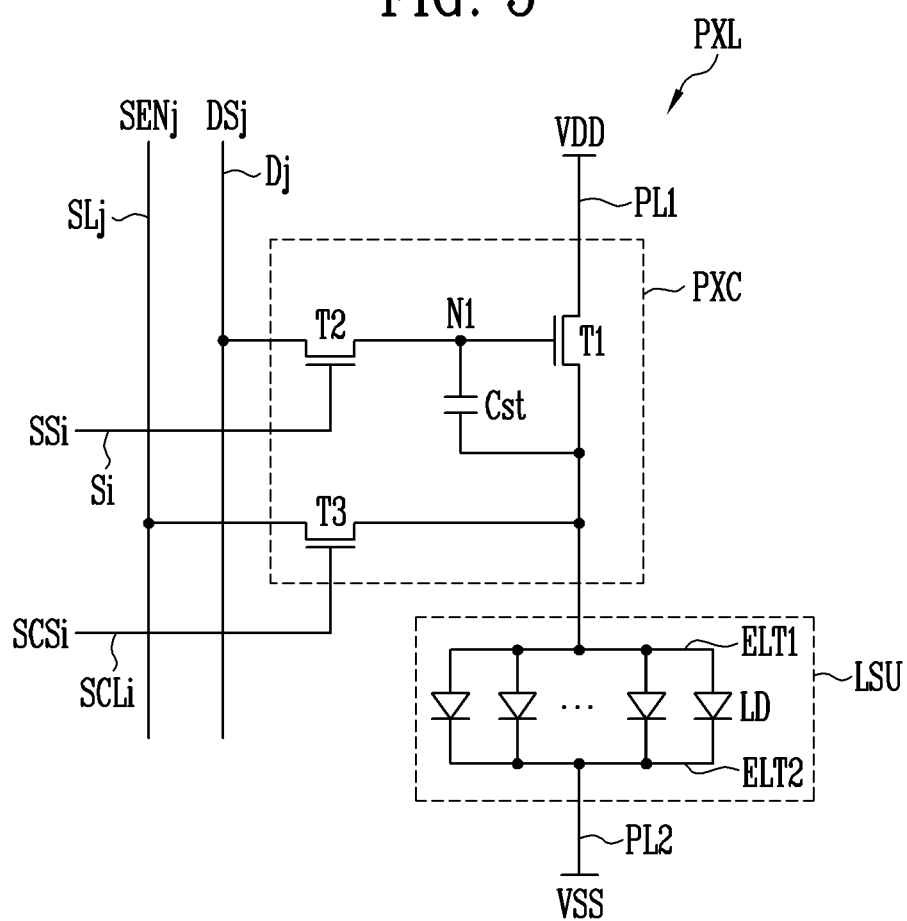
Figure 6:
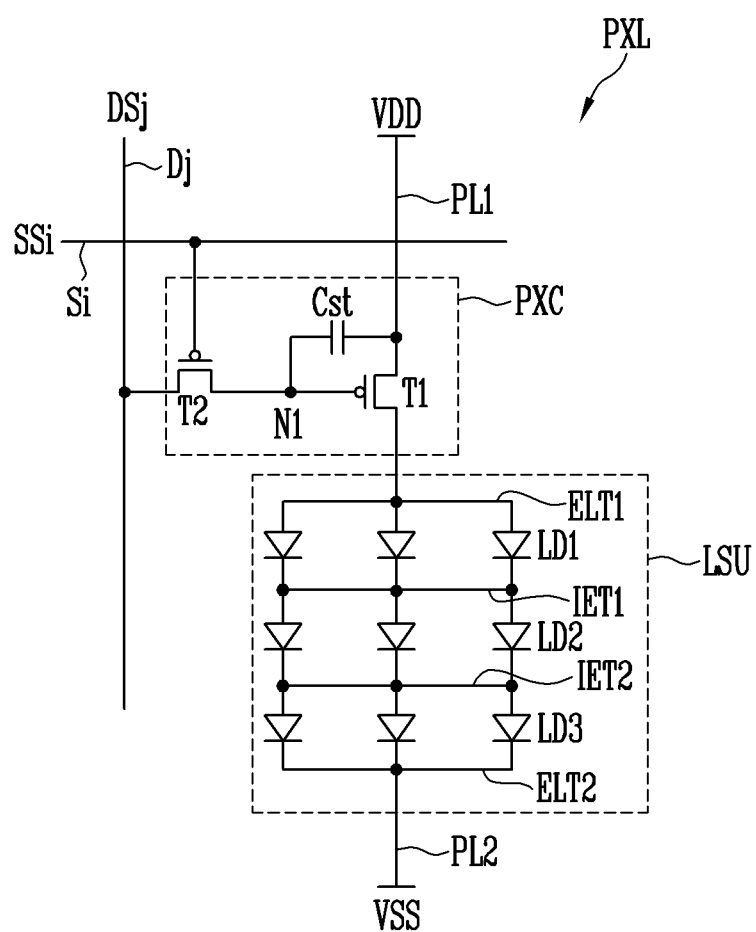

FIGS. 4 to 6 illustrate schematic diagrams of equivalent circuits of pixels according to an embodiment. For example, FIGS. 4 to 6 illustrate an embodiment of the pixel PXL that can be used in an active display device. However, the types of the pixel PXL and the display device are not limited thereto.

In some embodiments, the pixel PXL shown in FIGS. 4 to 6 may be one of the first pixel PXL1, the second pixel PXL2, and the third pixel PXL3 provided in the display panel PNL of FIG. 3. The first pixel PXL1, the second pixel PXL2, and the third pixel PXL3 may have substantially the same or similar structure(s).

Referring to FIG. 4, the pixel PXL may include a light source unit LSU for generating light at luminance corresponding to a data signal, and a pixel circuit PXC for driving a light source unit LSU.

The light source unit LSU may include at least one light emitting element electrically connected between a first power source VDD and a second power source VSS. For example, the light source unit LSU may include a first electrode ELT1 (also referred to as a "first pixel electrode" or a "first alignment electrode") electrically connected to the first power VDD via the pixel circuit PXC and a first power line PL1, a second electrode ELT2 (also referred to as a "second pixel electrode" or a "second alignment electrode") electrically connected to the second power VSS through a second power line PL2, and the light emitting elements LD electrically connected in a same direction between the first and second electrodes ELT1 and ELT2. In an embodiment, the first electrode ELT1 may be an anode electrode, and the second electrode ELT2 may be a cathode electrode.

Each of the light emitting elements LD may include a first end portion (for example, a p-type end portion) electrically connected to the first power source VDD through the first electrode ELT1 and/or the pixel circuit PXC, and a second end portion (for example, an n-type end portion) electrically connected to the second power source VSS through the second electrode ELT2. For example, the light emitting elements LD may be electrically connected in parallel in a forward direction between the first and second electrodes ELT1 and ELT2. Respective light emitting elements LD electrically connected in the forward direction between the first power source VDD and the second power source VSS configure respective effective light sources, and these effective light sources may configure the light source unit LSU of the pixel PXL.

The first and second power sources VDD and VSS may have different potentials so that the light emitting elements LD may emit light. For example, the first power source VDD may be set as a high potential power source, and the second power source VSS may be set as a low potential power source. A potential difference between the first and second power source sources VDD and VSS may be set to be equal to or higher than a threshold voltage of the light emitting elements LD during at least a light emitting period of the pixel PXL.

One end portions (or first end portions) (for example, p-type end portions) of the light emitting elements LD configuring (or forming) each light source unit LSU may be commonly connected to the pixel circuit PXC through an electrode (for example, the first pixel electrode ET1 of each pixel PXL) of the light source unit LSU and may be electrically connected to the first power source VDD through the pixel circuit PXC and the first power line PL1. Other end portions (or another or second end portions) (for example, n-type end portions) of the light emitting elements LD may be commonly connected to the second power source VSS through the other electrode (for example, the second electrode ELT2 of each pixel PXL) of the light source unit LSU and the second power line PL2.

The light emitting elements LD may emit light with a luminance corresponding to a driving current supplied through the corresponding pixel circuit PXC. For example, during each frame period, the pixel circuit PXC may supply a driving current, corresponding to a grayscale value to be displayed in the corresponding frame, to the light source unit LSU. The driving current supplied to the light source unit LSU may be divided to flow in the light emitting elements LD that are electrically connected in a forward direction. Therefore, while each light emitting element LD emits light with a luminance corresponding to the current flowing therein, the light source unit LSU may emit light having a luminance corresponding to the driving current.

The pixel circuit PXC may be electrically connected between the first power source VDD and the first electrode ELT1. The pixel circuit PXC may be electrically connected to a scan line Si and a data line Dj of the pixel PXL. For example, in case that the pixel PXL is disposed in an i-th horizontal line (row) (where i is a natural number) and a j-th vertical line (column) (where j is a natural number) of the display area DA, the pixel circuit PXC may be electrically connected to an i-th scan line Si and a j-th data line Dj of the display area DA.

In some embodiments, the pixel circuit PXC may include transistors and at least one capacitor. For example, the pixel circuit PXC may include a first transistor T1, a second transistor T2, and a storage capacitor Cst.

The first transistor T1 may be electrically connected between the first power source VDD and the light source unit LSU. For example, a first electrode (for example, a source electrode) of the first transistor T1 may be electrically connected to the first power source VDD, and a second electrode (for example, a drain electrode) of the first transistor T1 may be electrically connected to the first electrode ELT1. A gate electrode of the first transistor T1 may be electrically connected to a first node N1. The first transistor T1 may control a driving current supplied to the light source unit LSU in response to a voltage of the first node N1. For example, the first transistor T1 may be a driving transistor that controls a driving current of the pixel PXL.

The second transistor T2 may be electrically connected between the data line Dj and the first node N1. For example, a first electrode (for example, a source electrode) of the second transistor T2 may be electrically connected to the data line Dj, and a second electrode (for example, a drain electrode) of the second transistor T2 may be electrically connected to the first node 1. A gate electrode of the second transistor T2 may be electrically connected to the scan line Si. In case that a scan signal SSi of a gate-on voltage (for example, a low level voltage) may be supplied from the scan line Si to the second transistor T2, the second transistor T2 is turned on to electrically connect the data line Dj and the first node N1.

For each frame period, a data signal DSj of the corresponding frame is supplied to the data line Dj, and the data signal DSj may be transmitted to the first node N1 through the turned-on transistor T2 during a period in which the scan signal SSi of the gate-on voltage is supplied. For example, the second transistor T2 may be a switching transistor for transmitting each data signal DSj to the inside of the pixel PXL.

An electrode of the storage capacitor Cst may be electrically connected to the first power source VDD, and another electrode thereof may be electrically connected to the first node N1. The storage capacitor Cst may be charged with a voltage corresponding to the data signal DSj supplied to the first node N1 during each frame period.

FIG. 4 illustrates that the transistors included in the pixel circuit PXC, for example, the first and second transistors T1 and T2, are all p-type transistors, but the disclosure is not limited thereto, and a least one of the first and second transistors T1 and T2 may be changed to an n-type transistor. The pixel circuit PXC may be configured as a pixel circuit having various structures and/or driving methods.

Referring to FIG. 5, the pixel circuit PXC may be further electrically connected to a sensing control line SCLi and a sensing line SLj. For example, the pixel circuit PXC of the pixel PXL disposed on an i-th horizontal line and a j-th vertical line may be electrically connected to an i-th sensing control line SCLi and a j-th sensing line SLj of the display area DA. The pixel circuit PXC may further include a third transistor T3. As another example, the sensing line SLj may be omitted, and the characteristics of the pixel PXL may also be detected by detecting a sensing signal SENj through the data line Dj of the corresponding pixel PXL (or adjacent pixel), The third transistor T3 may be electrically connected between the first transistor T1 and the sensing line SLj. For example, an electrode of the third transistor T3 may be electrically connected to the electrode (for example, the source electrode) of the first transistor T1 electrically connected to the first electrode ELT1, and another electrode thereof may be electrically connected to the sensing line SLj. In case that the sensing line SLj is omitted, the other electrode of the third transistor T3 may also be electrically connected to the data line Dj.

A gate electrode of the third transistor T3 may be electrically connected to the sensing control line SCLi. In case that the sensing control line SCLi is omitted, the gate electrode of the third transistor T3 may be electrically connected to the scan line Si. The third transistor T3 may be turned on by a sensing control signal SCSi of a gate-on voltage (for example, a high level voltage) supplied to the sensing control line SCLi during a predetermined sensing period to electrically connect the sensing line SLj and the first transistor T1.

In some embodiments, the sensing period may be a period for extracting characteristics (for example, a threshold voltage of the first transistor T1) of each of the pixels PXL disposed in the display area DA. During the sensing period, the first transistor T1 may be turned on by supplying a predetermined reference voltage at which the first transistor T1 may be turned on to the first node N1 through the data line Dj and the second transistor T2 and by electrically connecting each pixel PXL to a current source or the like. By supplying the sensing control signal SCSi of a gate-on voltage to the third transistor T3 to turn on the third transistor T3, the first transistor T1 may be connected to the sensing line SLj. Thereafter, the sensing signal SENj is obtained through the sensing line SLj, and the characteristics of each pixel PXL including the threshold voltage of the first transistor T1 may be detected by using the sensing signal SENj. Information on the characteristics of each pixel PXL may be used to convert image data so that a characteristic difference between the pixels PXL disposed in the display area DA may be compensated for.

FIG. 5 illustrates an embodiment in which the first to third transistors T1, T2, and T3 are all n-type transistors, but the disclosure is not limited thereto. For example, at least one of the first to third transistors T1, T2, and T3 may be changed to a p-type transistor.

FIGS. 4 and 5 illustrate the embodiments in which effective light sources forming each light source unit LSU, for example, the light emitting elements LD, are all electrically connected in parallel, but the disclosure is not limited thereto. For example, as shown in FIG. 6, the light source unit LSU of each pixel PXL may be configured to include at least two stages in series. In describing embodiments of FIG. 6, detailed descriptions of the configuration (for example, the pixel circuit PXC) that are similar or identical to the embodiments of FIGS. 4 and 5 will be omitted.

Referring to FIG. 6, the light source unit LSU may include at least two light emitting elements electrically connected in series to each other. For example, the light source unit LSU may include a first light emitting element LD1, a second light emitting element LD2, and a third light emitting element LD3 that are electrically connected in series in a forward direction between the first power source VDD and the second power source VSS. Each of the first to third light emitting elements LD1, LD2, and LD3 may configure an effective light source.

Hereinafter, when referring to a specific light emitting element among the first to third light emitting elements LD1, LD2, and LD3, the corresponding light emitting element is referred to as a "first light emitting element LD1," "second light emitting element LD2," or "third light-emitting element LD3." When referring to at least one light emitting element among the first to third light emitting elements LD1, LD2, and LD3 or generically referring to the first to third light emitting elements LD1, LD2, and LD3, it will be referred to as "light emitting element LD" or "light emitting elements LD."

A first end portion (for example, a p-type end portion) of the first light emitting element LD1 may be electrically connected to the first power source VDD via the first electrode ELT1 (for example, a first pixel electrode) of the light source unit LSU. A second end portion (for example, an n-type end portion) of the first light emitting element LD1 may be electrically connected to a first end portion (for example, a p-type end portion) of the second light emitting element LD2 through a first middle electrode IET1.

The first end portion of the second light emitting element LD2 may be electrically connected to a second end portion of the first light emitting element LD1. The second end portion (for example, an n-type end portion) of the second light emitting element LD2 may be electrically connected to a first end portion (for example, a p-type end portion) of the third light emitting element LD3 through a second middle electrode IET2.

The first end portion of the third light emitting element LD3 may be electrically connected to a second end portion of the second light emitting element LD2. A second end portion of the third light emitting element LD3 (for example, an n-type end portion) may be electrically connected to the second power supply VSS via the second electrode (for example, a second pixel electrode ELT2) of the light source unit LSU. In the above-described manner, the first to third light emitting elements LD1, LD2, and LD3 may be sequentially electrically connected in series between the first and second electrodes ELT1 and ELT2 of the light source unit LSU.

FIG. 6 illustrates the embodiment of electrically connecting the light emitting elements LD in a three-stage serial structure, but the disclosure is not limited thereto, and two light emitting elements LD may be electrically connected in a two-stage serial structure, or four or more of light emitting elements LD may be electrically connected in a series structure of four or more stages.

Assuming that a same luminance is expressed using the light-emitting elements LD under a same condition (for example, a same size and/or number), in the light source unit LSU having a structure in which the light emitting elements LD are electrically connected in series compared to the light source unit LSU having a structure in which the light emitting elements LD are electrically connected in parallel, a voltage applied between the first and second electrodes ELT1 and ELT2 may increase, and a driving current flowing through the light source unit LSU may decrease. Therefore, in case that the light source unit LSU of each pixel PXL is configured by applying a serial structure, a panel current flowing through the display panel PNL may be reduced.

As in the above-described embodiment, each light source unit LSU may be connected to the first and second power sources VDD and VSS in a forward direction to be able to include the light emitting elements LD configuring each effective light source. The connection structure between the light emitting elements LD may be variously changed according to embodiments. For example, the light emitting elements LD may be electrically connected to each other only in series or in parallel or may be electrically connected in a series/parallel mixed structure.

Figure 7:
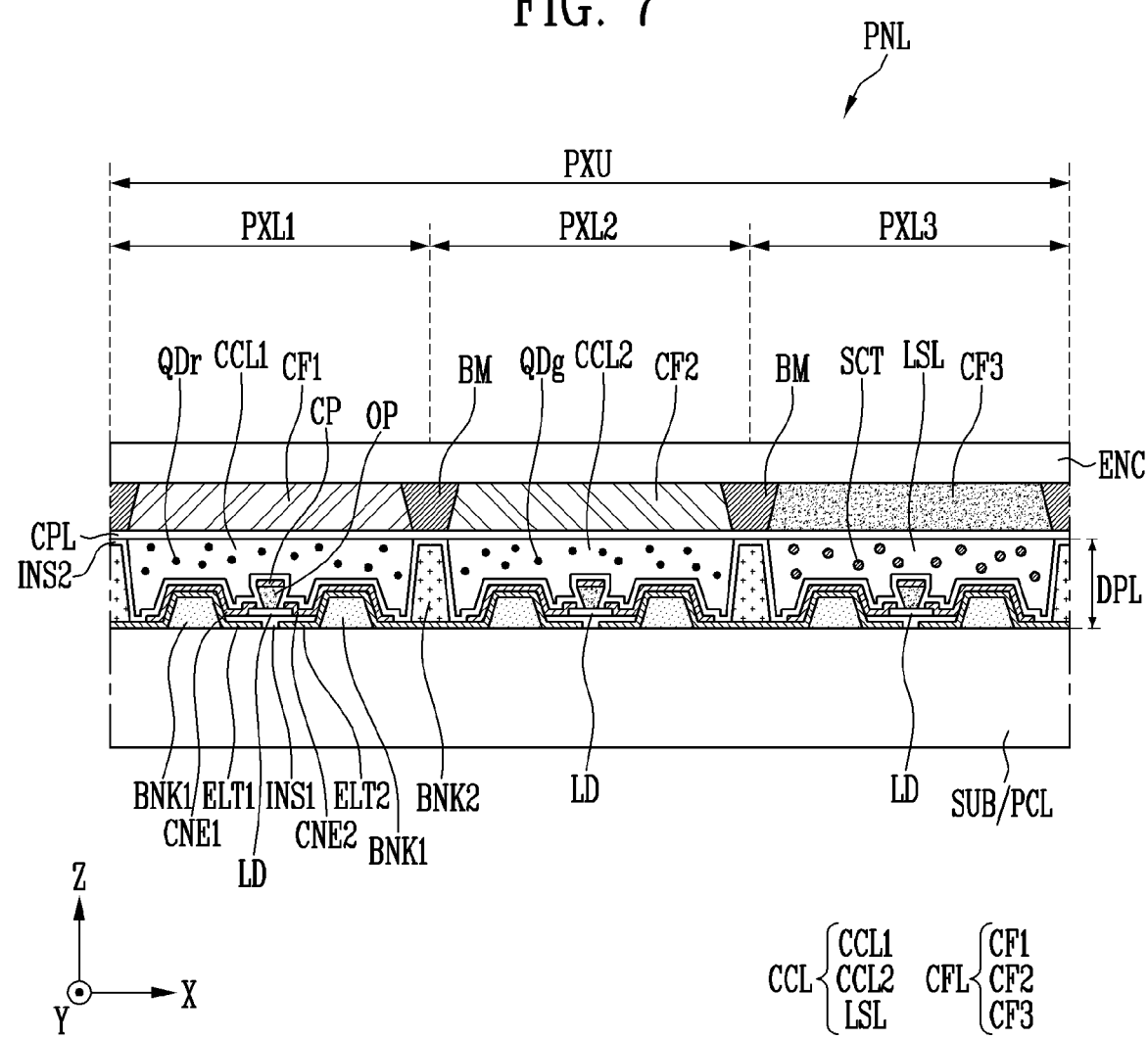
FIG. 7 schematically illustrates a cross-sectional view of a display device according to an embodiment.
Figure 8:
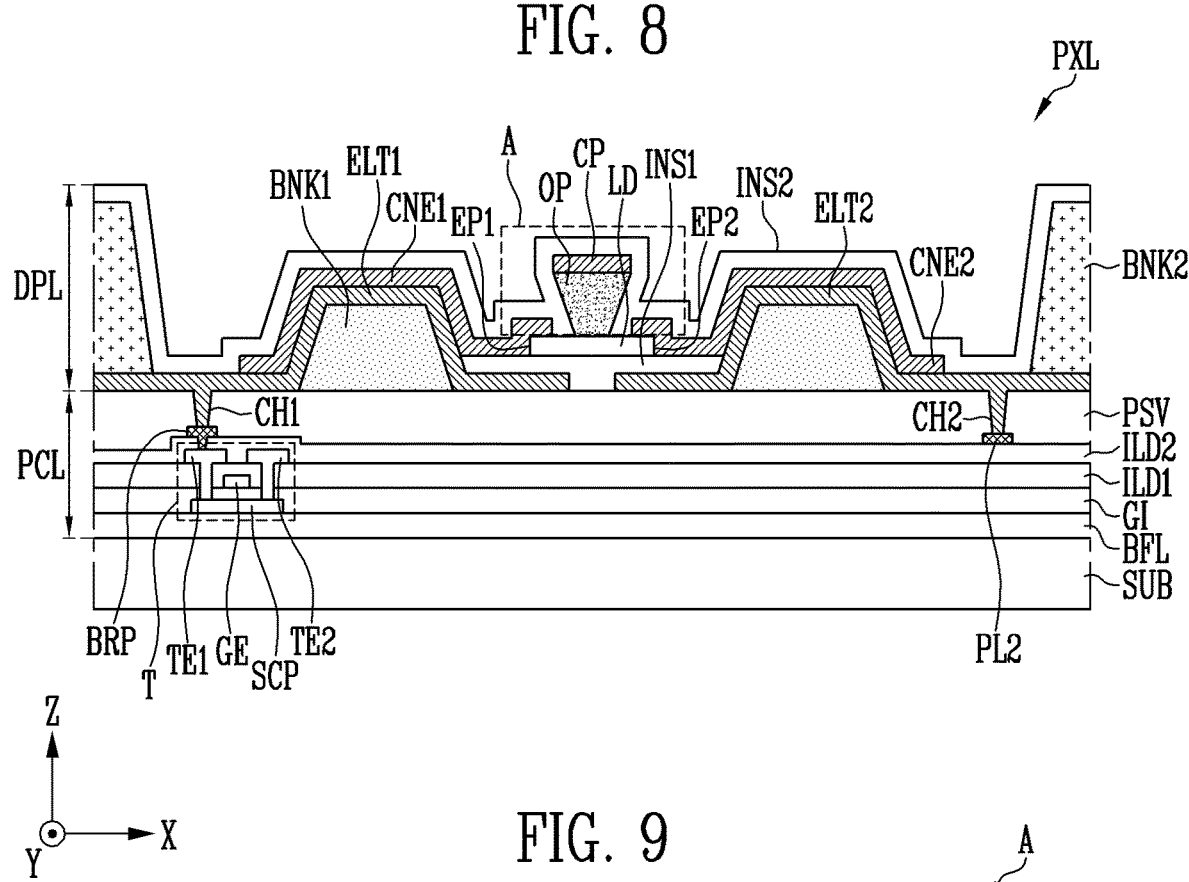
FIG. 8 schematically illustrates a cross-sectional view of a pixel of FIG. 7.
Figure 9:
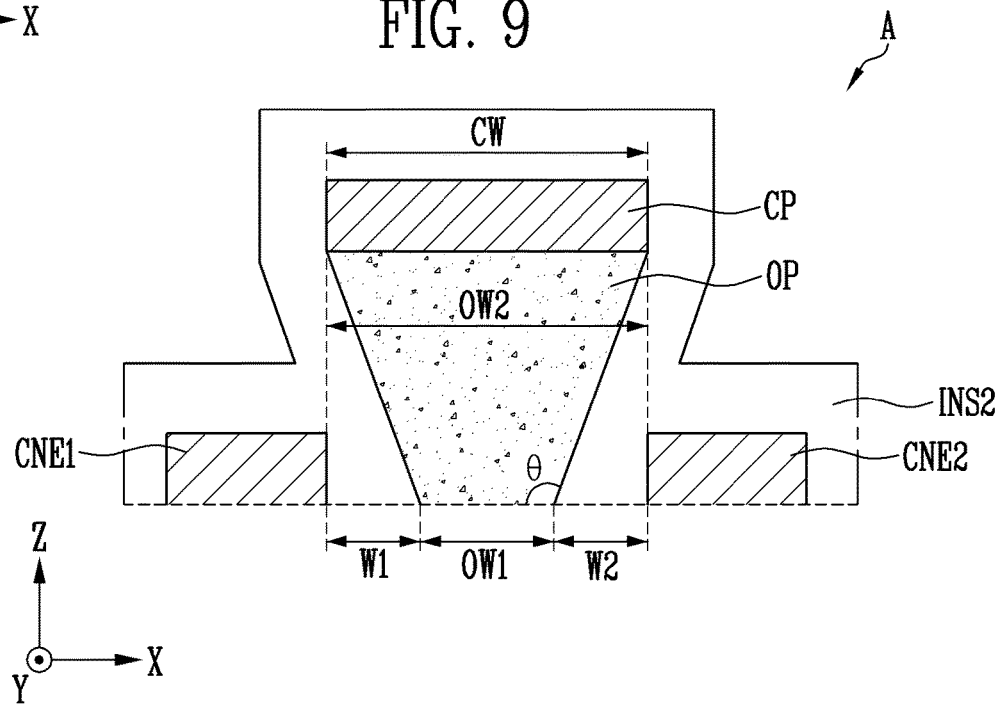
FIG. 9 schematically illustrates an enlarged cross-sectional view of area "A" of FIG. 8.

FIG. 7 illustrates a schematic cross-sectional view of a display device according to an embodiment. FIG. 8 illustrates a schematic cross-sectional view of a pixel of FIG. 7. FIG. 9 illustrates a schematic enlarged cross-sectional view of area "A" of FIG. 8.

FIG. 7 illustrates a cross-section of a display device, particularly, a display panel PNL provided in the display device, focusing on an area in which a pixel unit PXU including the first pixel PXL1, the second pixel PXL2, and the third pixel PXL3 adjacent to each other is disposed.

FIG. 8 schematically illustrates the structure of each pixel PXL based on a light emitting element LD and illustrates a transistor T (for example, the first transistor T1 in FIG. 4 or the like) electrically connected to the first electrode ELT1 for illustrating various circuit elements configuring the pixel circuit PXC. Hereinafter, in case that it is not necessary to separately specify the first transistor T1, the first transistor T1 will also be comprehensively referred to as a "transistor T."

A structure of the transistors T and/or a position of each layer thereof are not limited to the embodiments shown in FIG. 8 and may be variously changed according to embodiments. In an embodiment, the transistors T included in each pixel circuit PXC may have substantially identical or similar structure to each other, but the disclosure is not limited thereto. For example, in an embodiment, at least one of the transistors T included in the pixel circuit PXC may have a different cross-sectional structure from the remaining other transistors T, and/or may be disposed on a different layer.

Referring to FIGS. 7 and 8, the pixel PXL and the display device including the same may include a substrate SUB and a circuit layer PCL, a display layer DPL, a color conversion layer CCL, and a color filter layer CFL that are disposed on the substrate SUB. The circuit layer PCL may include transistors T configuring the pixel circuit PXC of each pixel PXL and insulation layers disposed between circuit elements.

Specifically, a buffer layer BFL may be disposed on the substrate SUB. The buffer layer BFL may prevent impurities from diffusing into each circuit element. The buffer layer BFL may be formed as a single layer but may also be formed as a multi-layer of at least double layers or more. In case that the buffer layer BFL is formed as the multi-layer, the respective layers may be made of a same material or different materials. Various circuit elements such as the transistors T and various wires (lines) electrically connected to the circuit elements may be disposed on the buffer layer BFL. In some embodiments, the buffer layer BFL may be omitted.

Each transistor T may include a semiconductor pattern SCP, a gate electrode GE, and first and second transistor electrodes TE1 and TE2. FIG. 8 illustrate an embodiment in which the transistor T includes the first and second transistor electrodes TE1 and TE2 formed separately from the semiconductor pattern SCP, but the disclosure is not limited thereto. For example, in an embodiment, the first and second transistor electrodes TE1 and/or TE2 provided in at least one transistor T may be integral with each semiconductor pattern SCP.

The semiconductor pattern SCP may be disposed on the buffer layer BFL. For example, the semiconductor pattern SCP may include a first area contacting each first transistor electrode TE1, a second area contacting each second transistor electrode TE2, and a channel area disposed between the first and second areas. In some embodiments, one of the first and second areas may be a source area, and the other thereof may be a drain area.

In some embodiments, the semiconductor pattern SCP may be made of polysilicon, amorphous silicon, an oxide semiconductor, or the like. The channel area of the semiconductor pattern SCP may be an intrinsic semiconductor as a semiconductor pattern that is not doped with impurities, and each of the first and second areas of the semiconductor pattern SCP may be a semiconductor doped with predetermined impurities.

A gate insulation layer GI may be disposed on the semiconductor pattern SCP. For example, the gate insulation layer GI may be disposed between the semiconductor pattern SCP and the gate electrode GE. The gate insulation layer GI may be configured as a single layer or multi-layer, and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The gate electrode GE may be disposed on the gate insulation layer GI. The gate electrode GE may be disposed on the gate insulation layer GI to overlap the semiconductor pattern SCP in a third direction (e.g., a Z-axis direction).

A first interlayer insulation layer ILD1 may be disposed on the gate electrode GE. For example, the first interlayer insulation layer ILD1 may be disposed between the gate electrode GE and the first and second transistor electrodes TE1 and TE2. The first interlayer insulation layer ILD1 may be configured as a single layer or multi-layer and may include a silicon oxide ($SiO_x$), a silicon nitride ($SiN_x$), a silicon oxynitride ($SiO_xN_y$), an aluminum nitride (AlNx), an aluminum oxide ($AlO_x$), a zirconium oxide ($ZrO_x$), a hafnium oxide ($HfO_x$), or a titanium oxide ($TiO_x$), and various types of inorganic materials.

The first and second transistor electrodes TE1 and TE2 may be disposed on the first interlayer insulation layer ILD1. The first and second transistor electrodes TE1 and TE2 may be disposed to overlap the semiconductor pattern SCP in the third direction (e.g., the Z-axis direction). The first and second transistor electrodes TE1 and TE2 may be electrically connected to the semiconductor pattern SCP. For example, the first transistor electrode TE1 may be electrically connected to a first area of the semiconductor pattern SCP through a contact hole penetrating the first interlayer insulation layer ILD1 and the gate insulation layer GI. The second transistor electrode TE2 may be electrically connected to a second area of the semiconductor pattern SCP through a contact hole penetrating the first interlayer insulation layer ILD1 and the gate insulation layer GI. In some embodiments, one of the first and second transistor electrodes TE1 and TE2 may be a source electrode, and the other thereof may be a drain electrode.

A second interlayer insulation layer ILD2 may be disposed on the first and second transistor electrodes TE1 and TE2. The second interlayer insulation layer ILD2 may be disposed on the first interlayer insulation layer ILD1 to cover (or overlap) the first and second transistor electrodes TE1 and TE2. The second interlayer insulation layer ILD2 may be configured as a single layer or multi-layer and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

A bridge pattern BRP and the second power line PL2 may be formed on the second interlayer insulation layer ILD2. The bridge pattern BRP may electrically connect the transistor T and the first electrode ELT1. For example, the first electrode ELT1 may be electrically connected to the bridge pattern BRP through a first contact hole CH1 penetrating a passivation layer PSV, and the bridge pattern BRP may be electrically connected to the first transistor electrode TE1 through a contact hole penetrating the second interlayer insulation layer ILD2.

The second power line PL2 may be electrically connected to the second electrode ELT2 disposed on the passivation layer PSV through a second contact hole CH2 penetrating the passivation layer PSV.

The bridge pattern BRP and the second power line PL2 may be formed of the same conductive layer. However, the disclosure is not limited thereto, and the second power line PL2 may be formed of a layer identical to that of the gate electrodes GE or the first and second transistor electrodes TE1 and TE2 of the transistors T.

The passivation layer PSV may be disposed on the circuit elements including the transistors T and/or on the wires including the second power line PL2. The passivation layer PSV may be made of an organic material in order to flatten a lower step thereof. For example, the passivation layer PSV may include an organic material such as an acrylates resin, an epoxy resin, a phenolic resin, a polyamides resin, a polyimides resin, a polyesters resin, a polyphenylenesulfides resin, or a benzocyclobutene (BCB). However, the disclosure is not limited thereto, and the passivation layer PSV may be configured as a single layer or multi-layer and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The display layer DPL may be disposed on the passivation layer PSV of the circuit layer PCL. The display layer DPL may include the first and second electrodes ELT1 and ELT2, first and second connection electrodes CNE1 and CNE2, and the light emitting elements LD of each pixel PXL.

Specifically, a first bank BNK1 may be disposed on the passivation layer PSV. The first banks BNK1 may be formed in a separate or integral pattern. The first bank BNK1 may have various shapes according to embodiments. In an embodiment, the first bank BNK1 may have a shape protruding in the third direction (e.g., the Z-axis direction) on the substrate SUB. The first bank BNK1 may have a normal tapered shape. For example, a side surface of the first bank BNK1 may form an acute angle with a surface of the substrate SUB. However, the disclosure is not limited thereto, and the first bank BNK1 may have a side wall having a curved surface or a step shape. For example, the first bank BNK1 may have a cross-section of a semicircle or semi-ellipse shape.

Electrodes and insulation layers disposed at an upper portion of the first bank BNK1 may have a shape corresponding to the first bank BNK1. For example, the first and second electrodes ELT1 and ELT2 disposed on the first bank BNK1 may include an inclined or curved surface having a shape corresponding to that of the first bank BNK1. Accordingly, the first bank BNK1, along with the first and second electrodes ELT1 and ELT2 provided thereon, may function as a reflective member that guides the light emitted from the light emitting elements LD in a front direction of the pixel PXL (e.g., the Z-axis direction) to improve the light emitting efficiency of the display panel PNL.

The first bank BNK1 may include at least one organic material and/or inorganic material. For example, the first bank BNK1 may include an organic material such as an acrylates resin, an epoxy resin, a phenolic resin, a polyamides resin, a polyimides resin, a polyesters resin, a polyphenylenesulfides resin, or a benzocyclobutene (BCB). However, it is not limited thereto, and the first bank BNK1 may be configured (or formed) as a single layer or multi-layer and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The first and second electrodes ELT1 and ELT2 may be disposed on the first bank BNK1. The first and second electrodes ELT1 and ELT2 may be disposed to be spaced apart from each other. The first and second electrodes ELT1 and ELT2 may receive an alignment signal (or alignment voltage) in an alignment process of the light emitting elements LD. Accordingly, an electric field may be formed between the first electrode ELT1 and the second electrode ELT2, so that the light emitting elements LD supplied to each pixel PXL may be aligned between the first electrode ELT1 and the second electrode ELT2.

The first electrode ELT1 may be electrically connected to the bridge pattern BRP through the first contact hole CH1 penetrating the passivation layer PSV and may be electrically connected to the first transistor electrode TE1 through the bridge pattern BRP. However, the disclosure is not limited thereto, and the first electrode ELT1 may be directly electrically connected to a power line or a signal line. The second electrode ELT2 may be electrically connected to the second power line PL2 through the second contact hole CH2 penetrating the passivation layer PSV.

Each of the first and second electrodes ELT1 and ELT2 may include at least one conductive material. For example, each of the first and second electrodes ELT1 and ELT2 may include at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the same, a conductive oxide such as an indium tin oxide (ITO), an indium zinc oxide (IZO), an indium tin zinc Oxide (ITZO), a zinc oxide (ZnO), an aluminum zinc oxide (AZO), a gallium zinc oxide (GZO), a zinc tin oxide (ZTO), a gallium tin oxide (GTO), or a fluorine tin oxide (FTO), and at least one conductive material among conductive polymers such as poly(3,4-ethylenedioxythiophene) (PEDOT), but are not limited thereto.

A first insulation layer INS1 may be disposed on the first and second electrodes ELT1 and ELT2. The first insulation layer INS1 may be configured as a single layer or multi-layer and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

A second bank BNK2 may be disposed on the first and second electrodes ELT1 and ELT2. The second bank BNK2 may be disposed at a boundary or edge of the pixel PXL to define a light emitting area. By partitioning the light emitting area of each pixel PXL by the second bank BNK2, the light emitting elements LD may be supplied in the light emitting area. For example, in a forming step of the light emitting elements LD, the second bank BNK2 may function as a dam structure defining a light emitting area of the pixel PXL to which the light emitting elements LD should be supplied.

The second bank BNK2 may include an organic material such as an acrylates resin, an epoxy resin, a phenolic resin, a polyamides resin, a polyimides resin, a polyesters resin, a polyphenylenesulfides resin, or a benzocyclobutene (BCB). However, the disclosure is not limited thereto, and the second bank BNK2 may be configured as a single layer or multi-layers and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The light emitting elements LD may be disposed in the light emitting area defined by the second bank BNK2. The light emitting elements LD may be disposed between the first electrode ELT1 and the second electrode ELT2 on the first insulation layer INS1. FIGS. 7 and 8 each illustrates a light emitting element LD disposed in each pixel PXL, but each pixel PXL may include light emitting elements LD provided between the first and second electrodes ELT1 and ELT2. Accordingly, hereinafter, it will be assumed and described that the pixel PXL includes light emitting elements LD.

The light emitting elements LD are prepared to be dispersed in a predetermined solution and may be supplied to the light emitting area of each pixel PXL by an inkjet printing method and the like. For example, the light emitting elements LD may be dispersed in a volatile solvent and be provided in each light emitting area. In case that a predetermined alignment signal (or alignment voltage) is supplied through the first and second electrodes ELT1 and ELT2 of respective pixels PXL, an electric field is formed between the first and second electrodes ELT1 and ELT2, and thus, the light emitting elements LD may be aligned between the first and second electrodes ELT1 and ELT2. After the light emitting elements LD are aligned, the light emitting elements LD may be stably arranged between the first and second electrodes ELT1 and ELT2 by volatilizing the solvent or eliminating it in other ways.

An organic pattern OP may be disposed on the light emitting elements LD. The organic pattern OP may be directly disposed on the light emitting elements LD. The organic pattern OP may be partially disposed on the light emitting elements LD. The organic pattern OP may expose the first and second end portions EP1 and EP2 of each of the light emitting elements LD. In case that the organic pattern OP is formed on the light emitting elements LD after the alignment of the light emitting elements LD is completed, it is possible to prevent the light emitting elements LD from deviating from an aligned position.

In an embodiment, the organic pattern OP prevents the first and second connection electrodes CNE1 and CNE2 from being short-circuited from each other, thereby stably securing a contact between the light emitting element LD and the first and second connection electrodes CNE1 and CNE2. This will be described in detail with reference to FIG. 9.

Referring to FIG. 9, the organic pattern OP may have a reversely tapered shape. For example, the organic pattern OP may taper toward the light emitting element. For example, a side surface of the organic pattern OP may have a reversely tapered shape. The side surface of the organic pattern OP may form an obtuse angle with a surface of the substrate SUB. An angle θ formed between the side surface of the organic pattern OP with a surface of the substrate SUB may be about 100° to about 150°. The angle θ formed between the side surfaces of the organic pattern OP and a surface of the substrate SUB may be about 110° to about 130°, but the disclosure is not limited thereto.

A width OW1 of a lower surface of the organic pattern OP in a first direction (an X-axis direction) may be smaller than a width OW2 of an upper surface of the organic pattern OP in the first direction (the X-axis direction). The lower surface of the organic pattern OP may be defined as a surface contacting the light emitting element LD, and the upper surface of the organic pattern OP may be defined as a surface facing the lower surface of the organic pattern OP.

The first connection electrode CNE1 may be disposed at a side of the organic pattern OP, and the second connection electrode CNE2 may be disposed at another side of the organic pattern OP. For example, the organic pattern OP may be disposed between the first connection electrode CNE1 and the second connection electrode CNE2.

The first connection electrode CNE1 may be disposed on the first end portion EP1 of the light emitting element LD. The first connection electrode CNE1 may contact the first end portion EP1 of the light emitting element LD exposed by the organic pattern OP. The first connection electrode CNE1 may be disposed on the first electrode ELT1. The first connection electrode CNE1 may contact the first electrode ELT1. For example, the first connection electrode CNE1 may electrically connect the first electrode ELT1 and the light emitting element LD.

The second connection electrode CNE2 may be disposed on the second end portion EP2 of the light emitting element LD. The second connection electrode CNE2 may contact the second end portion EP2 of the light emitting element LD exposed by the organic pattern OP. The second connection electrode CNE2 may be disposed on the second electrode ELT2. The second connection electrode CNE2 may contact the second electrode ELT2. For example, the second connection electrode CNE2 may electrically connect the second electrode ELT2 and the light emitting element LD.

In an embodiment, the first connection electrode CNE1 and the second connection electrode CNE2 may be made of the same conductive layer. For example, the first connection electrode CNE1 and the second connection electrode CNE2 may be simultaneously formed by a same process. The first connection electrode CNE1 and the second connection electrode CNE2 may be separated from each other by the organic pattern OP described above. For example, as the organic pattern OP is formed in a reversely tapered structure, the conductive layer may be electrically disconnected from the side surfaces of the organic pattern OP to be separated into the first connection electrode CNE1 and the second connection electrode CNE2. The first connection electrode CNE1 may be spaced apart from the side surface of the organic pattern OP in the first direction (e.g., the X-axis direction). A distance W1 in the first direction (or X-axis direction) between the side surface of the organic pattern OP and the first connection electrode CNE1 may be about 0.2 μm or greater. Similarly, the second connection electrode CNE2 may be spaced apart from the side surface of the organic pattern OP in the first direction (or X-axis direction). A distance W2 in the first direction (or X-axis direction) between the side surface of the organic pattern OP and the second connection electrode CNE2 may be about 0.2 μm or greater.

As described above, in case that the first connection electrode CNE1 and the second connection electrode CNE2 are electrically disconnected from each other by the organic pattern OP, even if the first connection electrode CNE1 and the second connection electrode CNE2 are simultaneously formed, it is possible to prevent the first connection electrode CNE1 and the second connection electrode CNE2 from being short-circuited from each other by the organic pattern OP. For example, as the organic pattern OP is formed in the reversely tapered structure, it is possible to prevent the first connection electrode CNE1 and the second connection electrode CNE2 from being short-circuited from each other, so that the first connection electrode CNE1 and the second connection electrode CNE2 may be simultaneously formed. For example, it is possible to simplify a manufacturing process of a display device by reducing the number of masks.

A conductive pattern CP may be disposed on the organic pattern OP. The conductive pattern CP may be disposed between the first connection electrode CNE1 and the second connection electrode CNE2 on the organic pattern OP. The conductive pattern CP may be directly disposed on an upper surface of the organic pattern OP.

In an embodiment, the conductive pattern CP and the first and second connection electrodes CNE1 and CNE2 may be formed of the same conductive layer. For example, the conductive pattern CP and the first and second connection electrodes CNE1 and CNE2 may be made of (or include) the same material. A thickness of the conductive pattern CP in the third direction (e.g., the Z-axis direction) may be substantially equal to the thicknesses of the third direction (Z-axis direction) of the first and second connection electrodes CNE1 and CNE2.

The conductive pattern CP and the first and second connection electrodes CNE1 and CNE2 may be simultaneously formed by a same process. The conductive pattern CP may be separated from the first connection electrode CNE1 and the second connection electrode CNE2 by the organic pattern OP and may be formed on the organic pattern OP. For example, as the organic pattern OP is formed in the reversely tapered structure, the conductive layer provided on the side surfaces of the organic pattern OP may be separated from the first connection electrode CNE1 and the second connection electrode CNE2. An end of the conductive pattern CP and an end of the first connection electrode CNE1 may be aligned with each other in the third direction (the Z-axis direction). Similarly, another end of the conductive pattern CP and an end of the second connection electrode CNE2 may be aligned with each other in the third direction (the Z-axis direction). The end and the other end of the conductive pattern CP may be respectively aligned with an end and another end of the upper surface of the organic pattern OP. A width CW of the conductive pattern CP in the first direction (or X-axis direction) may be substantially equal to the width OW2 of the upper surface of the organic pattern OP in the first direction (the X-axis direction).

The organic pattern OP may include an organic material such as an acrylates resin, an epoxy resin, a phenolic resin, a polyamides resin, a polyimides resin, a polyesters resin, a polyphenylenesulfides resin, or a benzocyclobutene (BCB). In an embodiment, the organic pattern OP may include a color filter material that selectively transmits light of a specific wavelength (or specific color). For example, in case that the light emitting element LD is a blue light emitting element that emits light of a third color (or blue color), the organic pattern OP may include a color filter material for selectively transmitting light of the third color (or blue color). Accordingly, improved color reproducibility may be secured.

Each of the first and second connection electrodes CNE1 and CNE2 and the conductive pattern CP may be made of various transparent conductive materials. For example, the first and second connection electrodes CNE1 and CNE2 and the conductive pattern CP may include at least one of various transparent materials such as an indium tin oxide (ITO), an indium zinc oxide (IZO), an indium tin zinc oxide (ITZO), a zinc oxide (ZnO), an aluminum zinc oxide (AZO), a gallium zinc oxide (GZO), a zinc tin oxide (ZTO), a gallium tin oxide (GTO), or a fluorine tin oxide (FTO), and they may be implemented to be substantially transparent or translucent to satisfy a predetermined transmittance. Accordingly, the light emitted from the first and second end portions EP1 and EP2 of the light emitting elements LD may pass through the first and second connection electrodes CNE1 and CNE2 and be emitted to the outside of the display panel PNL.

A second insulation layer INS2 may be disposed on the first and second connection electrodes CNE1 and CNE2 and the conductive pattern CP. For example, the second insulation layer INS2 may cover (or overlap) the first and second connection electrodes CNE1 and CNE2 and the conductive pattern CP. The second insulation layer INS2 may be disposed to cover the side surfaces of the organic pattern OP formed in the reversely tapered structure, as well as the first and second connection electrodes CNE1 and CNE2 and the conductive pattern CP. The second insulation layer INS2 may be directly disposed on the first and second connection electrodes CNE1 and CNE2, the conductive pattern CP, and the side surface of the organic pattern OP.

The second insulation layer INS2 may be configured as a single layer or multi-layer and may include a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

The color conversion layer CCL, a capping layer CPL, and the color filter layer CFL may be disposed on the display layer DPL.

The color conversion layer CCL may be disposed on the light emitting elements LD in an opening of the second bank BNK2. The color conversion layer CCL may include a first color conversion layer CCL1 disposed on the first pixel PXL1, a second color conversion layer CCL2 disposed on the second pixel PXL2, and a light scattering layer LSL disposed on the third pixel PXL3.

In an embodiment, the first to third pixels PXL1, PXL2, and PXL3 may include the light emitting elements LD that emit light of a same color. For example, the first to third pixels PXL1, PXL2, and PXL3 may include the light emitting elements LD that emit blue light in a wavelength band of about 400 nm to about 500 nm. The color conversion layer CCL including color conversion particles is disposed on at least some of the pixels PXL among the first to third pixels PXL1, PXL2, and PXL3, and thus a full-color image may be displayed. However, the disclosure is not limited thereto, and the first to third pixels PXL1, PXL2, and PXL3 may include light emitting elements LD that emit light of different colors. For example, the first pixel PXL1 may include a first color (or red color) light emitting element LD, the second pixel PXL2 may include a second color (or green color) light emitting element LD, and the third pixel PXL3 may include a third color (or blue color) light emitting element LD.

The first color conversion layer CCL1 may include first color conversion particles that convert light of the third color emitted from the light emitting element LD into light of the first color. For example, in case that the light emitting element LD is a blue light emitting element that emits blue light and the first pixel PXL1 is a red pixel, the first color conversion layer CCL1 may include a first quantum dot QDr that converts blue light emitted from the blue light emitting element into red light. For example, the first color conversion layer CCL1 may include first quantum dots QDr dispersed in a matrix material such as a base resin. The first quantum dot QDr may absorb blue light and shift a wavelength thereof according to energy transition to emit red light in a wavelength band of about 620 nm to about 780 nm. In case that the first pixel PXL1 is a pixel of a different color, the first color conversion layer CCL1 may include a first quantum dot QDr corresponding to a color of the first pixel PXL1.

The second color conversion layer CCL2 may include second color conversion particles that convert light of the third color emitted from the light emitting element LD into light of the second color. For example, in case that the light emitting element LD is a blue light emitting element that emits blue light and the second pixel PXL2 is a green pixel, the second color conversion layer CCL2 may include a second quantum dot QDg that converts blue light emitted from the blue light emitting element into green light. For example, the second color conversion layer CCL2 may include second quantum dots QDg dispersed in a matrix material such as a base resin. The second quantum dot QDg may absorb blue light and shift a wavelength thereof according to energy transition to emit green light in a wavelength band of about 500 nm to about 570 nm. In case that the second pixel PXL2 is a pixel of a different color, the second color conversion layer CCL2 may include a second quantum dot QDg corresponding to a color of the second pixel PXL2.

In an embodiment, the first quantum dot QDr and the second quantum dot QDg may have a spherical, pyramidal, and multi-arm shape, or a cube of a nano particle, a nanotube, a nanowire, a nanofiber, a nanoplate-shaped particle, or the like, but the disclosure is not limited thereto, and shapes of the first quantum dot QDr and the second quantum dot QDg may be variously changed.

In an embodiment, blue light having a relatively short wavelength among visible wavelengths is incident on the first quantum dot QDr and the second quantum dot QDg, and thus an absorption coefficient of each of the first quantum dot QDr and the second quantum dot QDg may be increased. Accordingly, the efficiency of light emitted from the first pixel PXL1 and the second pixel PXL2 may be increased, and improved color reproducibility may be secured. The light source unit LSU of the first to third pixels PXL1, PXL2, and PXL3 is formed by using the light emitting elements LD of a same color (for example, the blue color light emitting element), and thus the manufacturing efficiency of the display device may be increased.

The light scattering layer LSL may be selectively provided to efficiently use the third color (or blue color) light emitted from the light emitting element LD. For example, in case that the light emitting element LD is a blue light emitting element that emits blue light and the third pixel PXL3 is a blue pixel, the light scattering layer LSL may include at least one type of light scattering particles SCT to efficiently use light emitted from the light emitting element LD.

For example, the light scattering layer LSL may include light scattering particles SCT dispersed in a matrix material such as a base resin. For example, the light scattering layer LSL may include light scattering particles SCT such as silica, but materials included in the light scattering particles SCT are not limited thereto. The light scattering particles SCT are not disposed only in the third pixel PXL3. For example, the light scattering particles SCT may be selectively included in the first color conversion layer CCL1 or the second color conversion layer CCL2.

The capping layer CPL may be disposed on the color conversion layer CCL. The capping layer CPL may directly cover (or overlap) the color conversion layer CCL. A surface of the capping layer CPL may contact the color conversion layer CCL, and another surface of the capping layer CPL may contact the color filter layer CFL, which will be described below. The capping layer CPL may be entirely disposed on the first to third pixels PXL1, PXL2, and PXL3. The capping layer CPL may prevent impurities such as moisture or air from penetrating from the outside to damage or contaminate the color conversion layer CCL. The capping layer CPL is an inorganic layer and may include a silicon nitride ($SiN_x$), an aluminum nitride ($AlN_x$), a titanium nitride ($TiN_x$), a silicon oxide ($SiO_x$), an aluminum oxide ($AlO_x$), a titanium oxide ($TiO_x$), a silicon oxycarbide ($SiO_xC_y$), and a silicon oxynitride ($SiO_xN_y$).

The color filter layer CFL may be disposed on the capping layer CPL. The color filter layer CFL may be directly disposed on the capping layer CPL. The color filter layer CFL may include a color filter that matches the color of each pixel PXL. For example, the color filter layer CFL may include a first color filter CF1 that is disposed in the first pixel PXL1 to selectively transmit light generated from the first pixel PXL1, a second color filter CF2 that is disposed in the second pixel PXL2 to selectively transmit light generated from the second pixel PXL2, and a third color filter CF3 that is disposed in the third pixel PXL3 to selectively transmit light generated from the third pixel PXL3. In an embodiment, the first color filter CF1, the second color filter CF2, and the third color filter CF3 may be a red color filter, a green color filter, and a blue color filter, respectively, but the disclosure is not limited thereto. Hereinafter, when referring to one of the first color filter CF1, the second color filter CF2, and the third color filter CF3, or when comprehensively referring to two or more thereof, it will be referred to as the "color filter CF" or "color filters CF."

The first color filter CF1 may overlap the first color conversion layer CCL1 in the third direction (e.g., the Z-axis direction). The first color filter CF1 may include a color filter material that selectively transmits light of a first color (or red color). For example, in case that the first pixel PXL1 is a red pixel, the first color filter CF1 may include a red color filter material.

The second color filter CF2 may overlap the second color conversion layer CCL2 in the third direction (or Z-axis direction). The second color filter CF2 may include a color filter material that selectively transmits light of a second color (or green color). For example, in case that the second pixel PXL2 is a green pixel, the second color filter CF2 may include a green color filter material.

The third color filter CF3 may overlap the light scattering layer LSL in the third direction (or Z-axis direction). The third color filter CF3 may include a color filter material that selectively transmits light of a third color. For example, in case that the third pixel PXL3 is a blue pixel, the third color filter CF3 may include a blue color filter material. As described above, the third color filter CF3 and the organic pattern OP may include a same color filter material.

A light blocking pattern BM may be disposed between the color filters CF. The light blocking pattern BM may be disposed at the boundaries or edges of the first to third pixels PXL1, PXL2, and PXL3 so as to non-overlap the light emitting area of the pixels PXL. For example, the light blocking pattern BM may be disposed to overlap the second bank BNK2 in the third direction (or Z-axis direction). The light blocking pattern BM may include at least one of various types of light blocking materials, and/or a color filter material of a specific color. The light blocking pattern BM may be omitted in some embodiments. The first to third color filters CF1, CF2, and CF3 may be disposed at the boundary between the first to third pixels PXL1, PXL2, and PXL3 and overlap each other.

An encapsulation layer ENC may be disposed on the color filter layer CFL. The encapsulation layer ENC may cover (or overlap) the color filter layer CFL, the color conversion layer CCL, the display layer DPL, and the circuit layer PCL that are disposed therebelow. The encapsulation layer ENC may prevent moisture or air from penetrating into the above-mentioned lower members that are disposed therebelow. To this end, the encapsulation layer ENC may include at least one inorganic layer. For example, the inorganic layer may include at least one of an aluminum nitride ($AlN_x$), a silicon oxide ($SiO_x$), a silicon nitride ($SiN_x$), a silicon oxynitride ($SiO_xN_y$), a zirconium oxide ($ZrO_x$), a hafnium oxide ($HfO_x$), and a titanium oxide ($TiO_x$), but the disclosure is not limited thereto. The encapsulation layer ENC may protect the above-mentioned lower members from foreign matters such as dust. To this end, the encapsulation layer ENC may include at least one organic layer. For example, the organic layer may be an acryl resin, an epoxy resin, a phenolic resin, a polyamide resin, or a polyimide resin, but the disclosure is not limited thereto. As described above, in case that the encapsulation layer ENC is disposed on the color filter layer CFL, since a separate upper substrate may be omitted, the thickness of the display panel PNL may be minimized to improve light efficiency.

The display device of the above-described embodiment may have the organic pattern OP formed in the reversely tapered structure, thus preventing the first connection electrode CNE1 and the second connection electrode CNE2 from being short-circuited and allowing the first connection electrode CNE1 and the second connection electrode CNE2 to be simultaneously formed. For example, it is possible to simplify a manufacturing process of a display device by reducing the number of masks.

Hereinafter, an embodiment will be described. The same elements as those described above will be referred to as the same reference numerals in embodiments below, and repetitive descriptions thereof will be omitted or simplified.

Figure 10:
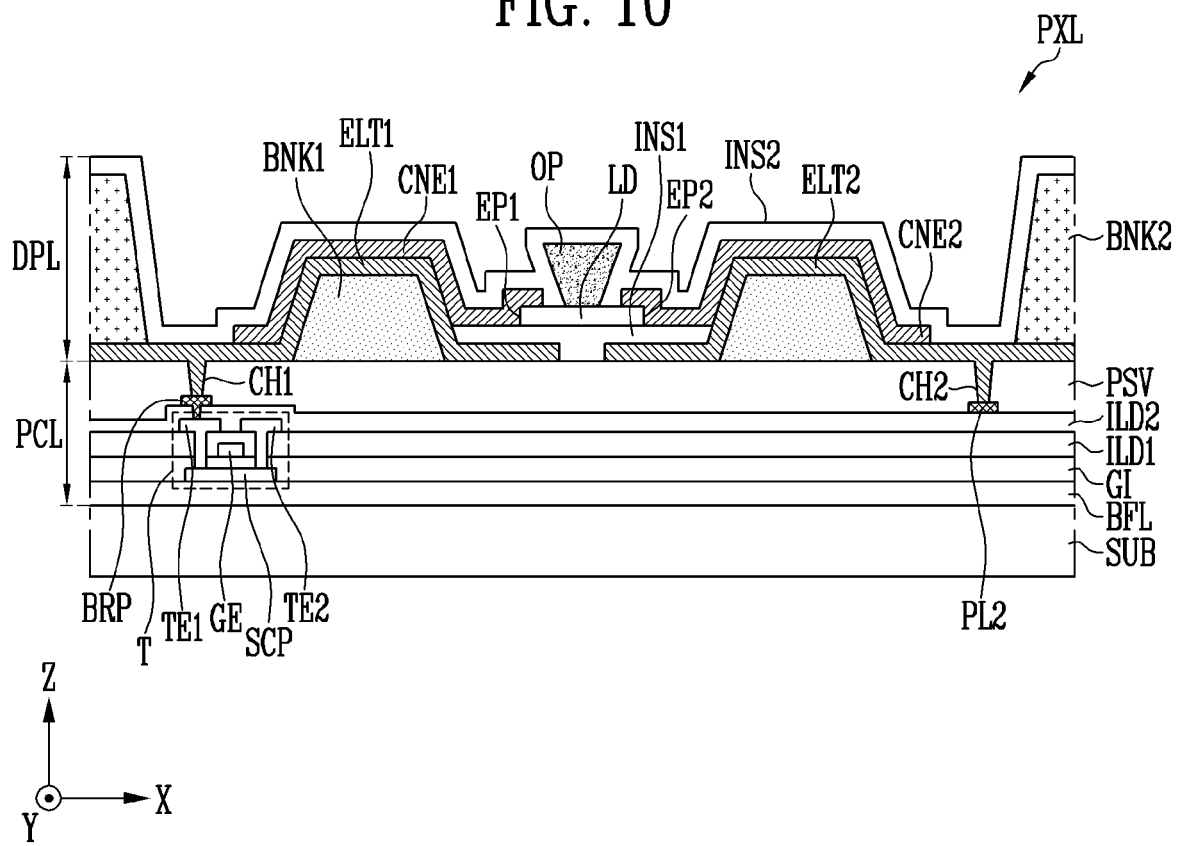
FIG. 10 schematically illustrates a cross-sectional view of a pixel according to another embodiment.

FIG. 10 illustrates a schematic cross-sectional view of a pixel according to an embodiment.

Referring to FIG. 10, the pixel PXL according to the embodiment is distinguished from the embodiment(s) of FIG. 1 to FIG. 9 at least in that the conductive pattern disposed on the organic pattern OP is omitted.

Specifically, the first connection electrode CNE1 and the second connection electrode CNE2 may be separated from each other by the organic pattern OP described above. For example, as the organic pattern OP is formed in a reversely tapered structure, the conductive layer may be electrically disconnected from the side surface of the organic pattern OP to be separated into the first connection electrode CNE1 and the second connection electrode CNE2. The first connection electrode CNE1 and the second connection electrode CNE2 may be spaced from each other with the organic pattern OP therebetween. In a process of separating the first connection electrode CNE1 and the second connection electrode CNE2 from each other, the conductive pattern (for example, the conductive pattern CP of FIG. 8) formed on the organic pattern OP may be removed by a subsequent process. As described above, in case that the conductive pattern formed on the organic pattern OP is removed, it is possible to more effectively prevent the first connection electrode CNE1 and the second connection electrode CNE2 from being short-circuited with each other.

The second insulation layer INS2 may be disposed on the first and second connection electrodes CNE1 and CNE2 and the organic pattern OP. For example, the second insulation layer INS2 may cover (or overlap) the first and second connection electrodes CNE1 and CNE2 and the organic pattern OP. The second insulation layer INS2 may be disposed to cover the side surfaces of the organic pattern OP formed in the reversely tapered structure, as well as the first and second connection electrodes CNE1 and CNE2 and the upper surface of the organic pattern OP. The second insulation layer INS2 may be directly disposed on the upper and side surfaces of the first and second connection electrodes CNE1 and CNE2 and of the organic pattern OP.

Since the first and second connection electrodes CNE1 and CNE2 and the organic pattern OP have been described with reference to FIGS. 1 to 9, repetitive descriptions thereof are omitted.

Figure 11:
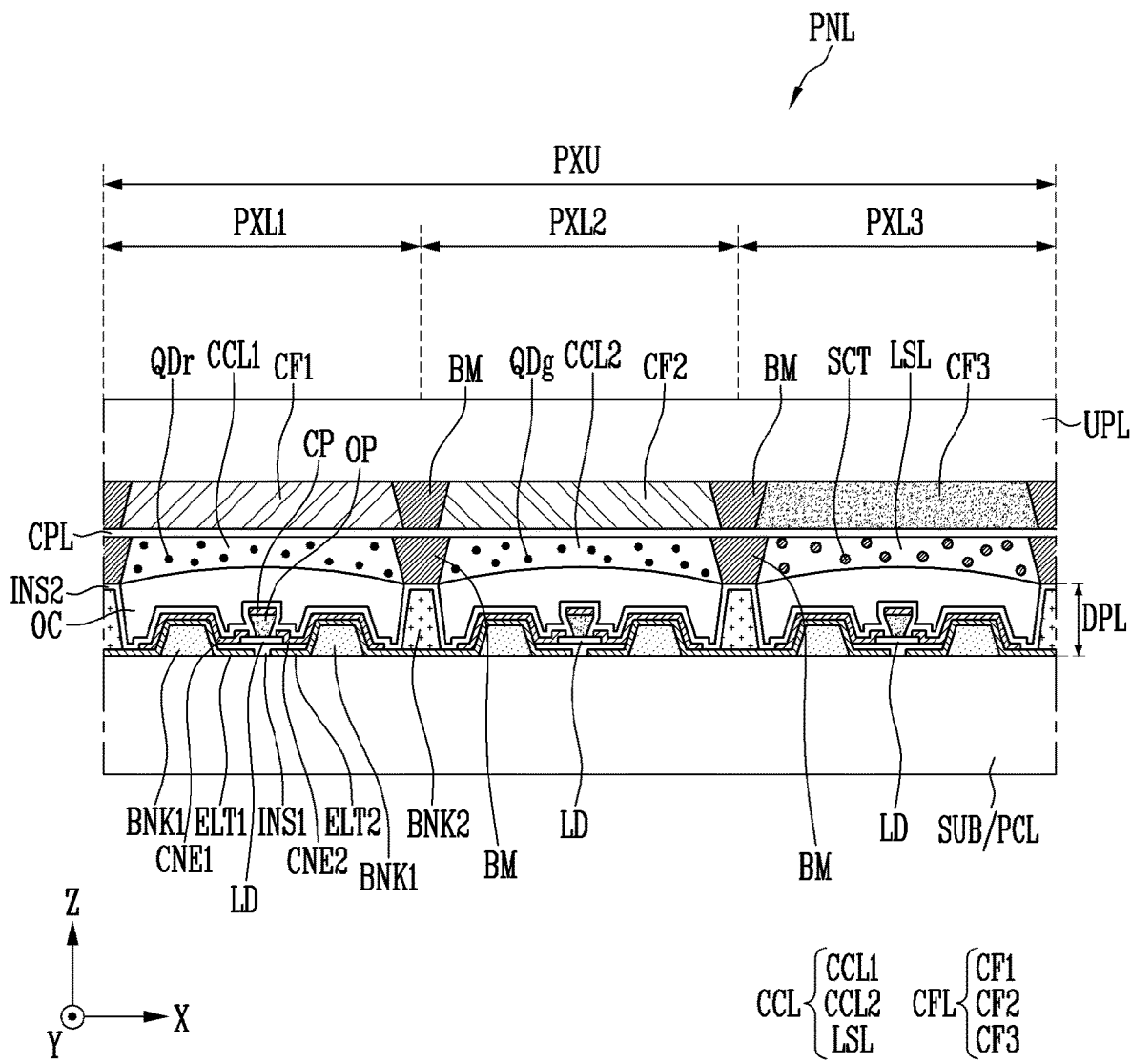
FIG. 11 schematically illustrates a cross-sectional view of a display device according to another embodiment.

FIG. 11 illustrates a schematic cross-sectional view of a display device according to an embodiment.

Referring to FIG. 11, the display device according to the embodiment differs from the embodiment(s) of FIGS. 1 to 9 at least in that an upper substrate UPL is disposed on the substrate SUB in which the first to third pixels PXL1, PXL2, and PXL3 is disposed.

Specifically, the upper substrate UPL (also referred to as an "encapsulation substrate" or "color filter substrate") encapsulating the first to third pixels PXL1, PXL2, and PXL3 may be disposed on a surface of the substrate SUB. The upper substrate UPL may include the color conversion layer CCL, the capping layer CPL, and the color filter layer CFL that overlap the first to third pixels PXL1, PXL2, and PXL3. In an embodiment, a space between a lower panel of the display panel PNL including the substrate SUB and the display layer DPL and an upper panel of the display panel PNL including the upper substrate UPL, the color filter layer CFL, and the color conversion layer CCL may be filled with an air layer or an overcoat layer OC having a relatively low refractive index in a range of about 1 to about 1.6.

The color conversion layer CCL, the capping layer CPL, and the color filter layer CFL may be disposed on a surface of the upper substrate UPL. For example, the color filter layer CFL may be formed on the upper substrate UPL, the capping layer CPL may be formed on the color filter layer CFL, and the color conversion layer CCL may be formed on the color filter layer CFL and the capping layer CPL. However, the disclosure is not limited thereto, and the order of formation of the color conversion layer CCL, the capping layer CPL, and the color filter layer CFL and/or the shapes thereof may be variously changed.

In some embodiments, the light blocking pattern BM may be disposed between the first to third color filters CF1, CF2, and CF3. The light blocking pattern BM may be disposed at the boundary or edge of the pixels PXL so as to non-overlap the light emitting area of the pixels PXL. For example, the light blocking pattern BM may be disposed to overlap the second bank BNK2. FIG. 11 illustrates a case in which the light blocking pattern BM is disposed on the upper substrate UPL, and the first to third color filters CF1, CF2, and CF3 are disposed in areas partitioned by the light blocking pattern BM, but the disclosure is not limited thereto. For example, in case that it is not necessary to first form the light blocking pattern BM according to a process method and/or the performance of printing equipment, the first to third color filters CF1, CF2, and CF3 may be first formed, and the light blocking pattern BM may be formed. For example, the order of formation of the color filter layer CFL and/or the position or shape according thereto may be variously changed according to embodiments.

Similarly, the light blocking pattern BM may be further disposed between the first and second color conversion layers CCL1 and CCL2 and the light scattering layer LSL. The light blocking pattern BM may be disposed at the boundary or edge of the pixels PXL so as to non-overlap the light emitting area of the pixels PXL. For example, the light blocking pattern BM may be disposed on the capping layer CPL, and the first color conversion layer CCL1, the second color conversion layer CCL2, and the light scattering layer LSL may be formed in the areas partitioned by the light blocking pattern BM, but the disclosure is not limited thereto. For example, in case that it is not necessary to first form the light blocking pattern BM according to a process method and/or the performance of printing equipment, the first color conversion layer CCL1, the second color conversion layer CCL2, and the light scattering layer LSL may be first used, and the light blocking pattern BM may be formed. For example, the order of formation of the color conversion layer CCL and/or the position or shape according thereto may be variously changed according to embodiments.

Since the color conversion layer CCL, the capping layer CPL, and the color filter layer CFL have been described with reference to FIG. 7, repetitive descriptions thereof are omitted.

Subsequently, a manufacturing method of the display device according to the above-described embodiment will be described.

FIGS. 12 to 15 illustrate schematic cross-sectional views of operations of a method of manufacturing a display device according to an embodiment. FIGS. 12 to 15 are schematic cross-sectional views for illustrating a manufacturing method of the display device of FIG. 8, and elements that are substantially identical or similar to those of FIG. 8 are denoted by the same reference numerals, and detailed descriptions thereof will be omitted.

Figure 12:
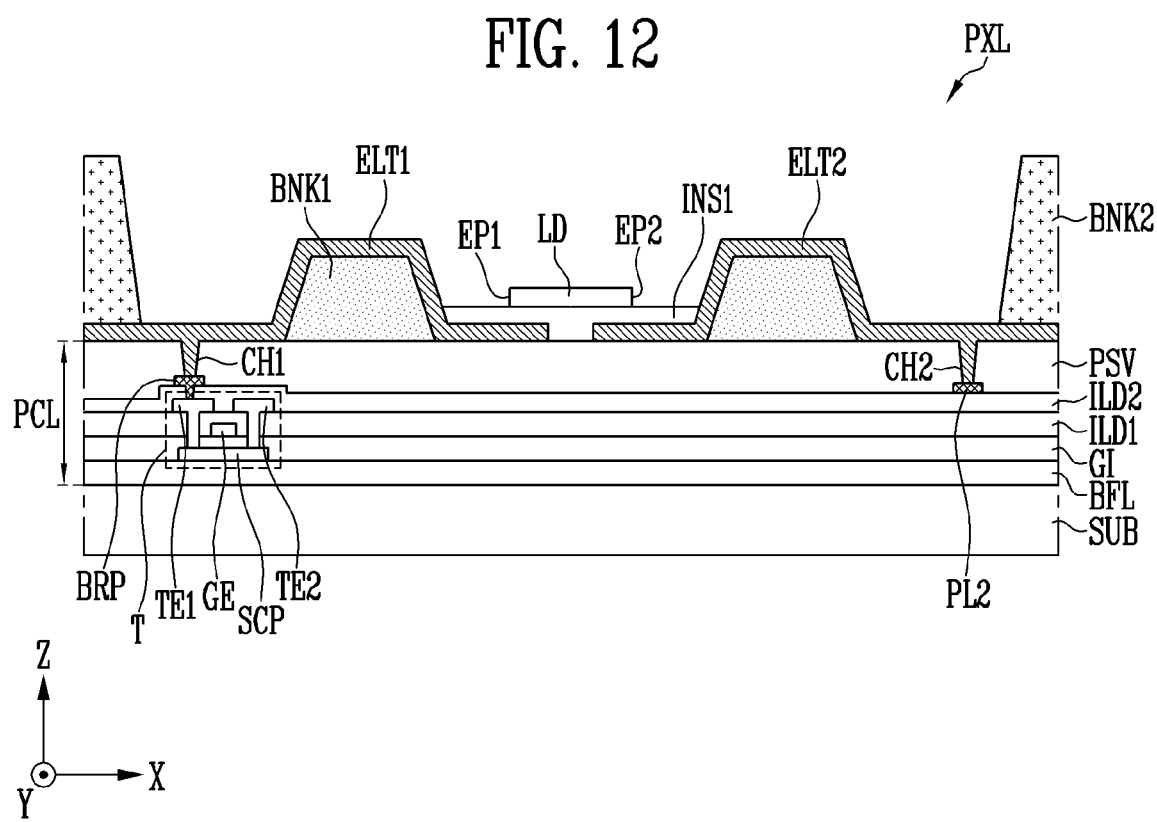
FIG. 12 to FIG. 15 schematically illustrate cross-sectional views of process steps of a manufacturing method of a display device according to an embodiment.

Referring to FIG. 12, the substrate SUB on which the above-described transistor T and the like are formed is first prepared, and the first bank BNK1, the first and second electrodes ELT1 and ELT2, the first insulation layer INS1, and the second bank BNK2 are formed on the substrate SUB.

The light emitting elements LD may be supplied and aligned between the first and second electrodes ELT1 and ELT2 spaced apart from each other. For example, the first and second electrodes ELT1 and ELT2 may receive a first alignment signal (or a first alignment voltage) and a second alignment signal (or a second alignment voltage), respectively, in an alignment step of the light emitting elements LD. For example, one of the first and second electrodes ELT1 and ELT2 may be supplied with an AC-type alignment signal, and the other of the first and second electrodes ELT1 and ELT2 may be supplied with an alignment voltage (for example, a ground voltage) having a constant voltage level. For example, an alignment signal may be applied to the first and second electrodes ELT1 and ELT2 in the alignment step of the light emitting elements LD.

The light emitting elements LD may be supplied to the light emitting area of each pixel PXL defined by the second bank BNK2 by an inkjet method, a slit coating method, or various other methods, and they may be aligned between the first and second electrodes ELT1 and ELT2 with directionality by an alignment signal (or alignment voltage) applied to each of the first and second electrodes ELT1 and ELT2. For example, the light emitting elements LD may be disposed between the first and second electrodes ELT1 and ELT2 so that the first end portion EP1 faces the first electrode ELT1 and the second end portion EP2 faces the second electrode ELT2.

Figure 13:
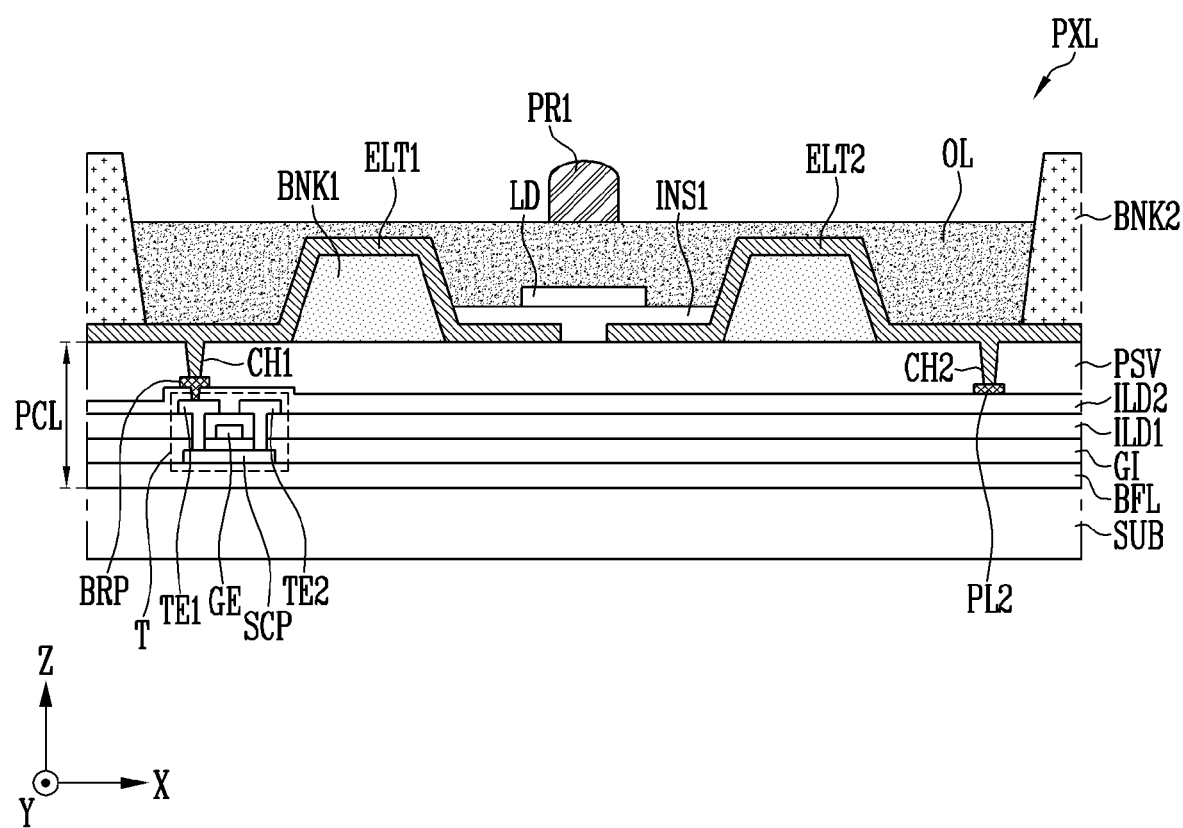

Referring to FIG. 13, subsequently, an organic film OL and a first photoresist PR1 are formed on the light emitting elements LD.

The organic film OL may be made of an organic material such as an acrylates resin, an epoxy resin, a phenolic resin, a polyamides resin, a polyimides resin, a polyesters resin, a polyphenylenesulfides resin, or a benzocyclobutene (BCB). In an embodiment, the organic film OL may include a color filter material that selectively transmits light of a specific color (or specific wavelength). For example, in case that the light emitting element LD is a blue light emitting element that emits light of a third color (or blue color), the organic film OL may include a color filter material for selectively transmitting light of the third color (or the blue color). Accordingly, improved color reproducibility may be secured.

The first photoresist PR1 may be formed on the organic film OL. The first photoresist PR1 may be formed on the organic film OL to overlap the light emitting element LD in the third direction (or Z-axis direction).

Figure 14:
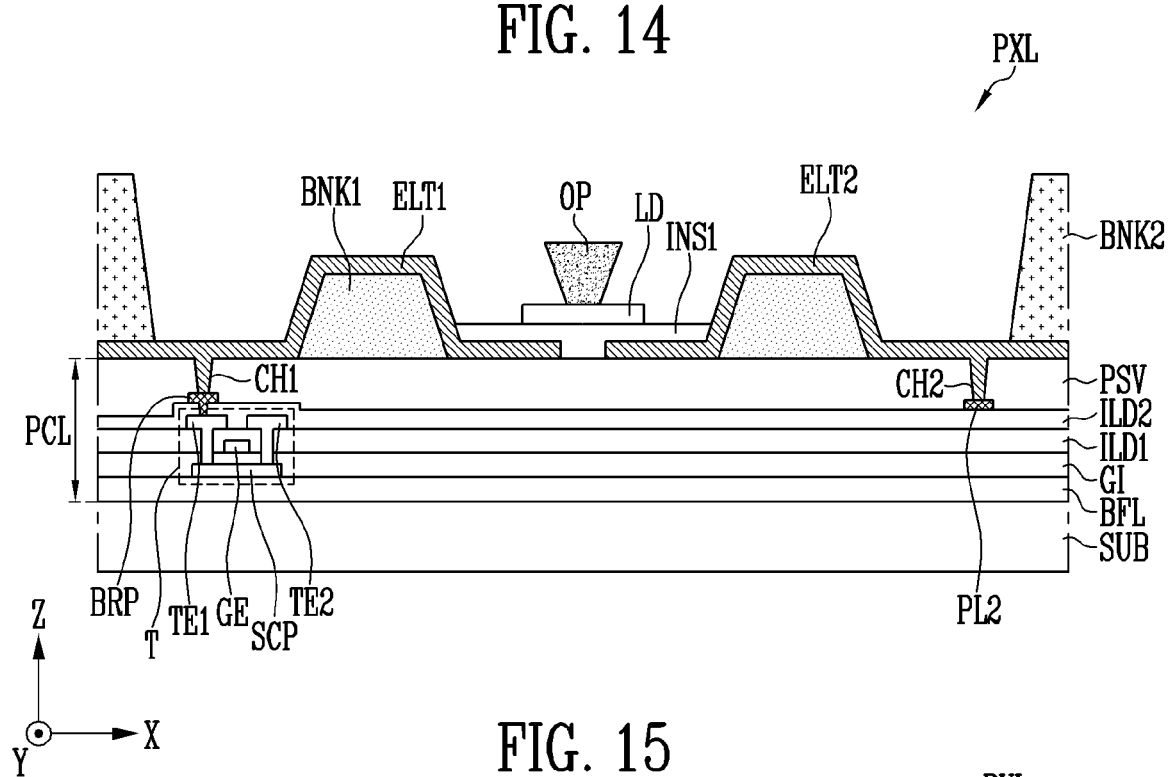

Referring to FIG. 14, the organic film OL is etched to form the organic pattern OP. In a process of etching the organic film OL, over-etching may be induced to form the organic pattern OP having a reversely tapered structure. As shown in FIG. 9, a side surface of the organic pattern OP may form an obtuse angle with a surface of the substrate SUB. The angle θ formed between the side surface of the organic pattern OP and the surface of the substrate SUB may be adjusted in a range of about 100° to about 150°. The angle θ formed between the side surfaces of the organic pattern OP and the surface of the substrate SUB may be adjusted in a range of about 110° to about 130°, but the disclosure is not limited thereto.

Figure 15:
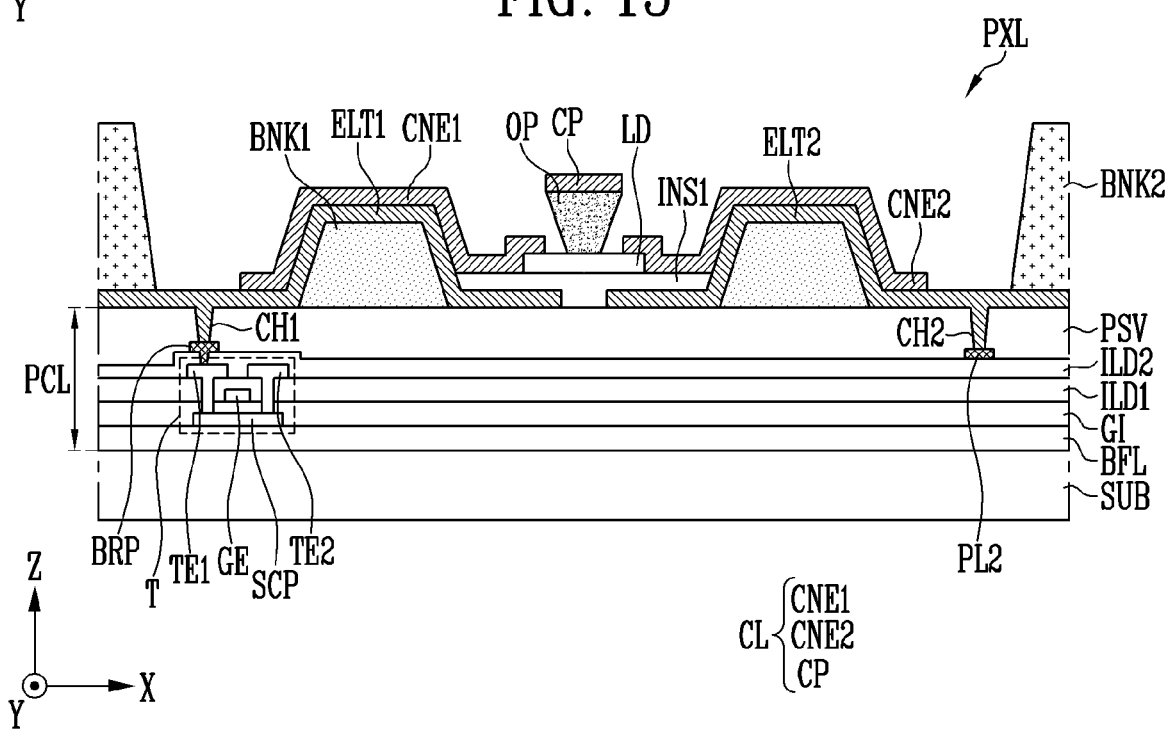

Referring to FIG. 15, subsequently, a connection electrode layer CL is formed on the first and second electrodes ELT1 and ELT2 and the organic pattern OP.

The connection electrode layer CL may be cut and electrically disconnected by the organic pattern OP to be separated into the first connection electrode CNE1, the second connection electrode CNE2, and the conductive pattern CP. For example, as the organic pattern OP is formed to have the reversely tapered structure, the connection electrode layer CL is cut and electrically disconnected at the side surface of the organic pattern OP, so that the first connection electrode CNE1, the second connection electrode CNE2, and the conductive pattern CP may be separated. For example, the first connection electrode CNE1 may be formed at a side of the organic pattern OP, the second connection electrode CNE2 may be formed at another side of the organic pattern OP, and the conductive pattern CP may be formed on the organic pattern OP.

The first connection electrode CNE1 may be formed on the first end portion EP1 of the light emitting element LD. The first connection electrode CNE1 may contact the first end portion EP1 of the light emitting element LD, exposed by the organic pattern OP. The first connection electrode CNE1 may be formed on the first electrode ELT1. The first connection electrode CNE1 may contact the first electrode ELT1. For example, the first connection electrode CNE1 may electrically connect the first electrode ELT1 and the light emitting element LD.

The second connection electrode CNE2 may be formed on the second end portion EP2 of the light emitting element LD. The second connection electrode CNE2 may contact the second end portion EP2 of the light emitting element LD, exposed by the organic pattern OP. The second connection electrode CNE2 may be formed on the second electrode ELT2. The second connection electrode CNE2 may contact the second electrode ELT2. For example, the second connection electrode CNE2 may electrically connect the second electrode ELT2 and the light emitting element LD.

As described above, in case that the first connection electrode CNE1 and the second connection electrode CNE2 are cut and electrically disconnected by the organic pattern OP, even if the first connection electrode CNE1 and the second connection electrode CNE2 are simultaneously formed, it is possible to prevent the first connection electrode CNE1 and the second connection electrode CNE2 from being short-circuited with each other by the organic pattern OP. For example, as the organic pattern OP is formed in the reversely tapered structure, it is possible to prevent the first connection electrode CNE1 and the second connection electrode CNE2 from being short-circuited with each other, so that the first connection electrode CNE1 and the second connection electrode CNE2 may be simultaneously formed. For example, as described above, the manufacturing process of the display device may be simplified by reducing the number of masks.

In case that the connection electrode layer CL is cut and electrically disconnected by the organic pattern OP, one end and another end of the conductive pattern CP may be respectively aligned with one end and another end of the upper surface of the organic pattern OP. As shown in FIG. 9, the width CW of the conductive pattern CP in the first direction (or X-axis direction) may be substantially equal to the width OW2 of the upper surface of the organic pattern OP in the first direction (the X-axis direction). One end of the conductive pattern CP and one end of the first connection electrode CNE1 may be aligned with each other in the third direction (the Z-axis direction). Another end of the conductive pattern CP and one end of the second connection electrode CNE2 may be aligned with each other in the third direction (or Z-axis direction). The first connection electrode CNE1 may be spaced apart from the side surface of the organic pattern OP in the first direction (or X-axis direction) by the reversely tapered structure of the organic pattern OP. The distance W1 between the side surfaces of the organic pattern OP and the first connection electrode CNE1 in the first direction (the X-axis direction) may be about 0.2 µm or greater. Similarly, the second connection electrode CNE2 may be spaced apart from the side surface of the organic pattern OP in the first direction (or X-axis direction). The distance W2 in the first direction (or X-axis direction) between the side surfaces of the organic pattern OP and the second connection electrode CNE2 may be about 0.2 µm or greater.

The connection electrode layer CL may include at least one of various transparent materials such as an indium tin oxide (ITO), an indium zinc oxide (IZO), an indium tin zinc oxide (ITZO), a zinc oxide (ZnO), an aluminum zinc oxide (AZO), a gallium zinc oxide (GZO), a zinc tin oxide (ZTO), a gallium tin oxide (GTO), or a fluorine tin oxide (FTO), and they may be implemented to be substantially transparent or translucent to satisfy a predetermined transmittance. Accordingly, the light emitted from the first and second end portions EP1 and EP2 of the light emitting elements LD may pass through the first and second connection electrodes CNE1 and CNE2 made of the connection electrode layer CL and be emitted to the outside of the display panel PNL.

Subsequently, the display device shown in FIG. 8 may be completed by forming the second insulation layer INS2 on the first and second connection electrodes CNE1 and CNE2 and the conductive pattern CP. The second insulation layer INS2 may be formed to cover (or overlap) the side surfaces of the organic pattern OP formed in the reversely tapered structure, as well as the first and second connection electrodes CNE1 and CNE2 and the conductive pattern CP. The second insulation layer INS2 may be directly formed on the first and second connection electrodes CNE1 and CNE2, the conductive pattern CP, and the side surface of the organic pattern OP.

The second insulation layer INS2 may be formed as a single layer or multi-layer and may be made of a silicon oxide ($SiO_x$), a silicon nitride ($SiN_x$), a silicon oxynitride ($SiO_xN_y$), an aluminum nitride ($AlN_x$), an aluminum oxide ($AlO_x$), a zirconium oxide ($ZrO_x$), a hafnium oxide ($HfO_x$), or a titanium oxide ($TiO_x$), and various types of inorganic materials.

Subsequently, an embodiment will be described. The same elements as those described above will be referred to by the same reference numerals in embodiments below, and repetitive descriptions thereof will be omitted or simplified.

Figure 16:
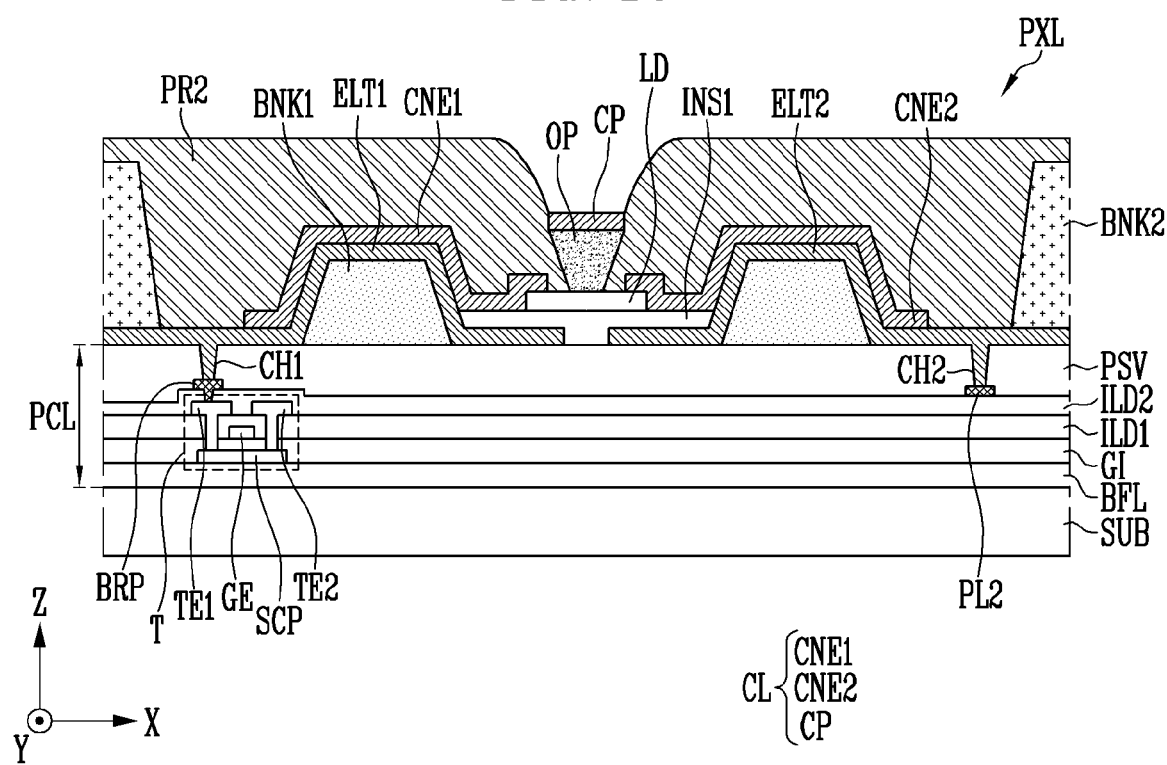

FIGS. 16 to 18 illustrate schematic cross-sectional views of process steps of a manufacturing method of a display device according to an embodiment. FIGS. 16 to 18 are schematic cross-sectional views for explaining the manufacturing method of the display device of FIG. 10, and elements that are substantially identical or similar to those of FIG. 10 are denoted by the same reference numerals, and detailed descriptions thereof will be omitted.

Referring to FIG. 16, after forming the first and second connection electrodes CNE1 and CNE2 and the conductive pattern CP by using the organic pattern OP, a second photoresist PR2 is formed on the first and second connection electrodes CNE1 and CNE2. The second photoresist PR2 is formed on the first and second connection electrodes CNE1 and CNE2 and may expose the conductive pattern CP.

Referring to FIG. 17, the conductive pattern CP is removed by etching the conductive pattern CP exposed by the second photoresist PR2. The etching process may be performed by wet etching, but the disclosure is not limited thereto. As described above, in case that the conductive pattern CP formed on the organic pattern OP is removed in a process of separating the first connection electrode CNE1 and the second connection electrode CNE2, it is possible to more effectively prevent the first connection electrode CNE1 and the second connection electrode CNE2 from being short-circuited with each other.

Referring to FIG. 18, subsequently, the remaining second photoresist PR2 is removed, and the display device illustrated in FIG. 10 may be completed by forming the second insulation layer INS2 on the first and second connection electrodes CNE1 and CNE2 and the organic pattern OP. The second insulation layer INS2 may be formed to cover (or overlap) the side surfaces of the organic pattern OP formed in the reversely tapered structure, as well as the first and second connection electrodes CNE1 and CNE2 and the upper surface of the organic pattern OP. The second insulation layer INS2 may be directly formed on the upper and side surfaces of the first and second connection electrodes CNE1 and CNE2 and of the organic pattern OP.

Those skilled in the art related to the embodiment will readily appreciate that many modifications are possible without materially departing from the novel teachings and advantages. The embodiments should be considered in a descriptive sense only and not for purposes of limitation. The scope of the disclosure, not by the detailed description given in the appended claims, and all differences within the equivalent scope will be construed as being included in the disclosure.

What is claimed is:

1. A display device comprising:
    a substrate including pixels;
    a first electrode and a second electrode that are spaced apart from each other on the substrate;
    a light emitting element disposed between the first electrode and the second electrode;
    a first connection electrode electrically contacting the first electrode and a first end of the light emitting element;
    a second connection electrode electrically contacting the second electrode and another end of the light emitting element;
    an organic pattern disposed between the first connection electrode and the second connection electrode and on the light emitting element, wherein
    the organic pattern tapers toward the light emitting element, and
    a distance between the first connection electrode and the second connection electrode in a first direction is substantially equal to a width of an upper surface of the organic pattern in the first direction; and
    a conductive pattern on the organic pattern, wherein the conductive pattern does not overlap the first connection electrode and the second connection electrode.

2. The display device of claim 1, wherein a side surface of the organic pattern is spaced apart from the first connection electrode.

3. The display device of claim 2, wherein a width between the side surface of the organic pattern and the first connection electrode is about 0.2 µm or greater.

4. The display device of claim 1, wherein
    the pixels include:
    a first pixel that emits a first color;
    a second pixel that emits a second color; and
    a third pixel that emits a third color, and
    the organic pattern selectively transmits the third color.

5. The display device of claim 4, further comprising:
a first color filter disposed in the first pixel;
a second color filter disposed in the second pixel; and
a third color filter disposed in the third pixel.

6. The display device of claim 5, wherein the organic pattern and the third color filter include a same material.

7. The display device of claim 1, wherein the first connection electrode and the second connection electrode are made of a same conductive layer.

8. The display device of claim 1, wherein the organic pattern exposes the first end and the another end of the light emitting element.

9. The display device of claim 2, further comprising an insulation layer contacting and overlapping the side surface of the organic pattern.

10. The display device of claim 9, wherein the insulation layer contacts and overlaps the first connection electrode and the second connection electrode.

11. The display device of claim 1, wherein the conductive pattern is disposed between the first connection electrode and the second connection electrode.

12. The display device of claim 1, wherein the conductive pattern is electrically disconnected from the first connection electrode and the second connection electrode.

13. The display device of claim 1, wherein the conductive pattern, the first connection electrode, and the second connection electrode include a same material.

14. The display device of claim 1, wherein a thickness of the conductive pattern is substantially equal to a thickness of the first connection electrode and a thickness of the second connection electrode.

* * * * *